(12) United States Patent
Matsumura et al.

(10) Patent No.: US 8,507,575 B2
(45) Date of Patent: Aug. 13, 2013

(54) RADIATION-SENSITIVE RESIN COMPOSITION, POLYMER, AND COMPOUND

(75) Inventors: Nobuji Matsumura, Tokyo (JP); Yukio Nishimura, Tokyo (JP); Akimasa Soyano, Tokyo (JP); Ryuichi Serizawa, Tokyo (JP); Noboru Otsuka, Tokyo (JP); Hiroshi Tomioka, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/272,523

(22) Filed: Oct. 13, 2011

(65) Prior Publication Data

US 2012/0065291 A1 Mar. 15, 2012

Related U.S. Application Data

(63) Continuation of application No. PCT/JP2010/056718, filed on Apr. 14, 2010.

(30) Foreign Application Priority Data

| Apr. 15, 2009 | (JP) | 2009-098982 |
| May 28, 2009 | (JP) | 2009-129665 |
| Aug. 20, 2009 | (JP) | 2009-191426 |
| Feb. 12, 2010 | (JP) | 2010-028339 |

(51) Int. Cl.
- C08F 20/22 (2006.01)
- B29D 11/00 (2006.01)
- H05B 6/68 (2006.01)
- C08G 61/04 (2006.01)

(52) U.S. Cl.
USPC ............... 522/183; 522/182; 522/178; 522/1; 520/1

(58) Field of Classification Search
USPC ............... 522/183, 182, 178, 1; 520/1
See application file for complete search history.

(56) References Cited

U.S. PATENT DOCUMENTS

| 4,491,628 | A | 1/1985 | Ito et al. | |
| 5,945,250 | A * | 8/1999 | Aoai et al. | 430/270.1 |
| 7,442,485 | B2 * | 10/2008 | Oshima et al. | 430/138 |
| 7,932,334 | B2 * | 4/2011 | Ando et al. | 526/243 |
| 2002/0068241 | A1 | 6/2002 | Oohashi et al. | |
| 2004/0086799 | A1 | 5/2004 | Oohashi et al. | |
| 2005/0016402 | A1 | 1/2005 | Oshima et al. | |
| 2007/0149702 | A1 | 6/2007 | Ando et al. | |
| 2009/0297979 | A1 | 12/2009 | Hatakeyama et al. | |
| 2010/0040977 | A1 | 2/2010 | Nagai et al. | |

FOREIGN PATENT DOCUMENTS

| JP | 02-027660 B2 | 6/1990 |
| JP | 09-325497 | 12/1997 |
| JP | 10-221852 | 8/1998 |
| JP | 2002-107929 | 4/2002 |
| JP | 2004-099797 | 4/2004 |
| JP | 2004-125832 | 4/2004 |

(Continued)

OTHER PUBLICATIONS

International Search Report for International Application No. PCT/JP2010/056718, Jul. 13, 2010.

(Continued)

*Primary Examiner* — Ling Choi
*Assistant Examiner* — Jessica E Whiteley
(74) *Attorney, Agent, or Firm* — Ditthavong Mori & Steiner, P.C.

(57) ABSTRACT

A radiation-sensitive resin composition includes a first polymer including a repeating unit represented by a following formula (I). $X^+$ is an onium cation. $X^+$ in the formula (I) is preferably an onium cation represented by a following formula (1-1), an onium cation represented by a following formula (1-2) or a combination thereof.

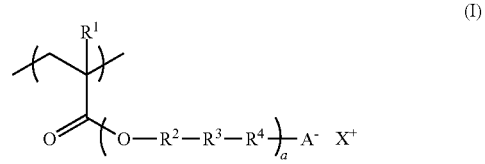

(I)

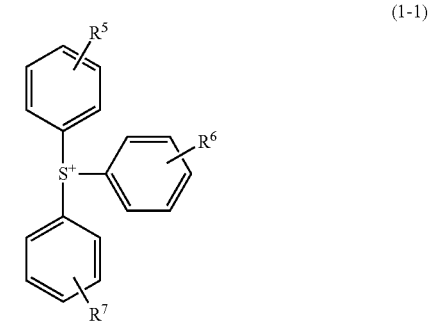

(1-1)

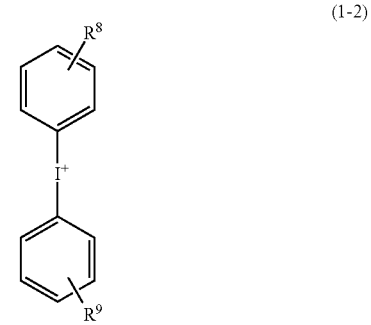

(1-2)

22 Claims, No Drawings

(56) References Cited

FOREIGN PATENT DOCUMENTS

| | | |
|---|---|---|
| JP | 2004-287338 | 10/2004 |
| JP | 2005-067041 | 3/2005 |
| JP | 2006-062323 | 3/2006 |
| JP | 2006-178317 | 7/2006 |
| JP | 2006-227632 | 8/2006 |
| JP | 2007-192907 | 8/2007 |
| JP | 2007-197718 | 8/2007 |
| JP | 2007-328060 | 12/2007 |
| JP | 2009-053688 | 3/2009 |
| JP | 2009-093137 * | 4/2009 |
| JP | 2010-002593 | 1/2010 |
| JP | 2010-002599 | 1/2010 |
| JP | 2010-013627 | 1/2010 |
| JP | 2010-085971 | 4/2010 |
| WO | WO 2005/069076 | 7/2005 |
| WO | WO 2006/035790 | 4/2006 |
| WO | WO 2008/056795 | 5/2008 |
| WO | WO 2008/056796 | 5/2008 |
| WO | WO 2009/019793 | 2/2009 |

OTHER PUBLICATIONS

Japanese Office Action for corresponding JP Application No. 2009-129665, Jul. 4, 2012.

* cited by examiner

RADIATION-SENSITIVE RESIN COMPOSITION, POLYMER, AND COMPOUND

CROSS-REFERENCES TO RELATED APPLICATIONS

The present application is a continuation application of International Application No. PCT/JP2010/056718, filed Apr. 14, 2010, which claims priority to Japanese Patent Application No. 2009-098982, filed Apr. 15, 2009, to Japanese Patent Application No. 2009-129665, filed May 28, 2009, to Japanese Patent Application No. 2009-191426, filed Aug. 20, 2009, and to Japanese Patent Application No. 2010-028339, filed Feb. 12, 2010. The contents of these applications are incorporated herein by reference in their entirety.

BACKGROUND OF THE INVENTION

1. Field of the Invention

The present invention relates to a radiation-sensitive resin composition, a polymer and a compound.

2. Discussion of the Background

Chemically amplified radiation-sensitive resin compositions form a resist pattern on a substrate by: irradiating with a radioactive ray such as deep ultraviolet light typified by KrF excimer laser or ArF excimer laser to generate an acid at a light-exposed site; and changing the rate of dissolution in a developing solution at the light-exposed site relative to the light-unexposed site by a reaction catalyzed by the acid.

When a line width is to be controlled even more precisely, for example, when design dimensions of a device are not greater than a sub-half micron level, important features required for chemically amplified resists include not only excellent resolving ability, but also capability of providing small LWR (Line Width Roughness) that is a marker of variation in line widths of the resist pattern, and capability of providing a rectangular pattern configuration. In a known technique for the purpose of controlling such fine shapes, a basic compound is added as an acid diffusion controlling agent for regulating the velocity of diffusion of the generated acid. In particular, acid diffusion controlling agents that lose acid diffusion controllability upon dissociation due to the acid have attracted attention in terms of excellent contrast between the light-exposed site and the light-unexposed site. See Japanese Examined Patent Application Publication No. H02-27660 and Japanese Unexamined Patent Application Publication No. 2009-53688.

SUMMARY OF THE INVENTION

According to one aspect of the present invention, a radiation-sensitive resin composition includes a first polymer including a repeating unit represented by a formula (I).

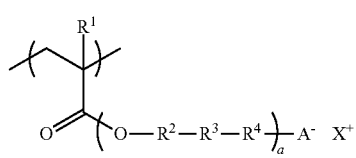
(I)

$R^1$ represents a hydrogen atom, a methyl group or a trifluoromethyl group. Each of $R^2$ and $R^4$ independently represents a single bond, a linear or branched bivalent hydrocarbon group having 1 to 10 carbon atoms, a bivalent hydrocarbon group having 3 to 20 carbon atoms which has a cyclic structure formed by a part or all of the carbon atoms, or a group derived therefrom by substituting a part or all of hydrogen atoms with a fluorine atom. $R^3$ represents a single bond, a —O— group, a —C(=O)— group, a —O—C(=O)— group, a —C(=O)—O— group or a sulfinyl group. $A^-$ represents —N$^-$—SO$_2$—R$^D$, —COO$^-$, —O$^-$ or —SO$_3^-$, wherein $R^D$ represents a linear or branched monovalent hydrocarbon group having 1 to 10 carbon atoms, a monovalent hydrocarbon group having 3 to 20 carbon atoms which has a cyclic structure formed by a part or all of the carbon atoms, or a group derived therefrom by substituting a part or all of hydrogen atoms with a fluorine atom. $X^+$ represents an onium cation. "a" is 0 or 1, wherein an end of $R^4$ at SO$_3^-$ side is other than —CF$_2$— when $A^-$ is —SO$_3^-$, each of $R^2$, $R^3$ and $R^4$ is not a single bond at a same time when $A^-$ is —COO$^-$, and $A^-$ is other than —O$^-$ when "a" is 1.

According to another aspect of the present invention, a polymer includes a repeating unit represented by a following formula (I).

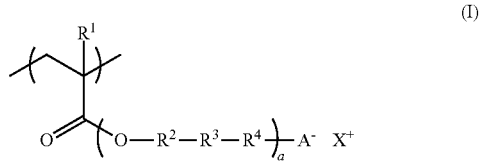
(I)

$R^1$ represents a hydrogen atom, a methyl group or a trifluoromethyl group. Each of $R^2$ and $R^4$ independently represents a single bond, a linear or branched bivalent hydrocarbon group having 1 to 10 carbon atoms, a bivalent hydrocarbon group having 3 to 20 carbon atoms which has a cyclic structure formed by a part or all of the carbon atoms, or a group derived therefrom by substituting a part or all of hydrogen atoms with a fluorine atom. $R^3$ represents a single bond, a —O— group, a —C(=O)— group, a —O—C(=O)— group, a —C(=O)—O— group or a sulfinyl group. $A^-$ represents —N$^-$—SO$_2$—R$^D$, —COO$^-$, —O$^-$ or —SO$_3^-$. $R^D$ represents a linear or branched monovalent hydrocarbon group having 1 to 10 carbon atoms, a monovalent hydrocarbon group having 3 to 20 carbon atoms which has a cyclic structure formed by a part or all of the carbon atoms, or a group derived therefrom by substituting a part or all of hydrogen atoms with a fluorine atom. $X^+$ represents an onium cation. "a" is 0 or 1, wherein an end of $R^4$ at SO$_3^-$ side is other than —CF$_2$— when $A^-$ represents —SO$_3^-$, each of $R^2$, $R^3$ and $R^4$ is not a single bond at a same time when $A^-$ is —COO$^-$, and $A^-$ is other than —O$^-$ when "a" is 1.

According to further aspect of the present invention, a compound is represented by a following formula (i).

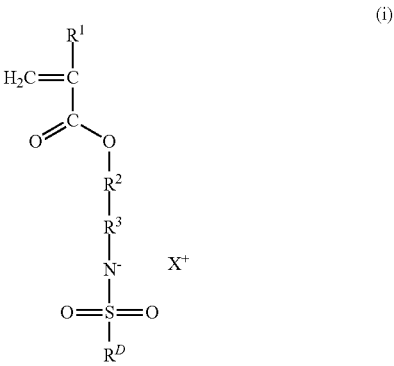
(i)

$R^1$ represents a hydrogen atom, a methyl group or a trifluoromethyl group. $R^2$ represents a linear or branched bivalent hydrocarbon group having 1 to 10 carbon atoms, a bivalent hydrocarbon group having 3 to 20 carbon atoms which has a cyclic structure formed by a part or all of the carbon atoms, or a group derived therefrom by substituting a part or all of hydrogen atoms with a fluorine atom. $R^3$ represents a single bond, a —C(=O)-group, a —O—C(=O)-group or a sulfinyl group. $R^D$ represents a linear or branched monovalent hydrocarbon group having 1 to 10 carbon atoms, a monovalent hydrocarbon group having 3 to 20 carbon atoms which has a cyclic structure formed by a part or all of the carbon atoms, or a group derived therefrom by substituting a part or all of hydrogen atoms with a fluorine atom. $X^+$ represents an onium cation.

According to further aspect of the present invention, a compound is represented by a following formula (ii).

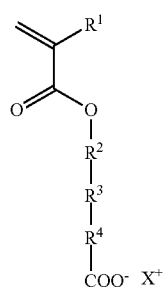

(ii)

$R^1$ represents a hydrogen atom, a methyl group or a trifluoromethyl group. Each of $R^2$ and $R^4$ independently represents a single bond, a linear or branched bivalent hydrocarbon group having 1 to 10 carbon atoms, a bivalent hydrocarbon group having 3 to 20 carbon atoms which has a cyclic structure formed by a part or all of the carbon atoms, or a group derived therefrom by substituting a part or all of hydrogen atoms with a fluorine atom. $R^3$ represents a single bond, a —O— group, a —C(=O)— group, a —C(=O)—O— group or a —O—C(=O)-group, wherein each of $R^2$, $R^3$ and $R^4$ is not a single bond at a same time. $X^+$ represents an onium cation.

DESCRIPTION OF THE EMBODIMENTS

An embodiment of the present invention is directed to a radiation-sensitive resin composition containing (A) a polymer (hereinafter, may be also referred to as "polymer (A)") having a repeating unit represented by the following formula (I) (hereinafter, may be also referred to as "repeating unit (I)"):

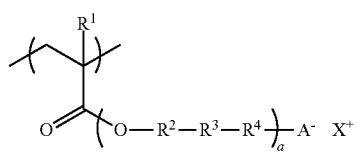

(I)

(wherein, $R^1$ represents a hydrogen atom, a methyl group or a trifluoromethyl group; $R^2$ and $R^4$ each independently represent a single bond, a linear or branched bivalent hydrocarbon group having 1 to 10 carbon atoms, a bivalent hydrocarbon group having 3 to 20 carbon atoms which is cyclic or has a cyclic partial structure, or a group derived therefrom by substituting a part or all of hydrogen atoms with a fluorine atom; $R^3$ represents a single bond, a —O— group, a —C(=O)— group, a —O—C(=O)— group, a —C(=O)—O— group or a sulfinyl group; $A^-$ represents —N$^-$—SO$_2$—R$^D$, —COO$^-$, —O$^-$ or SO$_3^-$; $R^D$ represents a linear or branched monovalent hydrocarbon group having 1 to 10 carbon atoms, a monovalent hydrocarbon group having 3 to 20 carbon atoms which is cyclic or has a cyclic partial structure, or a group derived therefrom by substituting a part or all of hydrogen atoms with a fluorine atom; $X^+$ represents an onium cation; "a" is 0 or 1; provided that A represents SO$_3^-$, the end at SO$_3^-$ side of $R^4$ is other than —CF$_2$—; provided that $A^-$ represents —COO$^-$, $R^2$, $R^3$ and $R^4$ are avoided from all representing a single bond at the same time; and provided that "a" is 1, $A^-$ is other than —O$^-$.)

When a radiation-sensitive acid generator is included, the polymer (A) in the radiation-sensitive resin composition serves as a base with respect to the acid generated upon exposure, and then loses basicity by degradation upon irradiation with actinic radiation or a radioactive ray. Accordingly, the acid is diffused in the radiation-sensitive resin composition containing the polymer (A) at the light-exposed site, whereas the diffusion of the acid at the light-unexposed site is controlled, and thus a favorable contrast can be provided. Furthermore, since a structure having acid diffusion controllability is present in the polymer, uniform acid diffusion controllability at the light-unexposed site can be exhibited. Therefore, favorable LWR characteristics and pattern configuration can be attained.

In the polymer (A), $X^+$ in the above formula (I) preferably represents at least one selected from the group consisting of onium cations each represented by the following formulae (1-1) and (1-2):

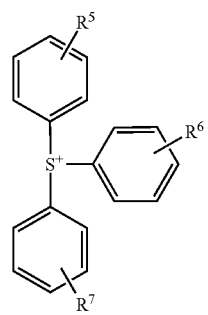

(1-1)

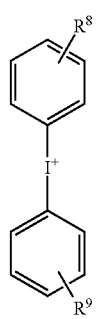

(1-2)

(wherein, $R^5$ to $R^9$ each independently represent a hydrogen atom, a hydroxyl group, a halogen atom, an alkyl group having 1 to 10 carbon atoms which may have a substituent, a cycloalkyl group having 3 to 12 carbon atoms which may have a substituent or an alkoxy group having 1 to 10 carbon atoms which may have a substituent.)

Since each polymer has the aforementioned particular onium cation, the radiation-sensitive resin composition can have favorable radioactive ray sensitivity.

It is preferred that the radiation-sensitive resin composition further contains (B1) a polymer (hereinafter, may be also referred to as "polymer (B1)") having a repeating unit represented by the following formula (3) (hereinafter, may be also referred to as "repeating unit (3)"):

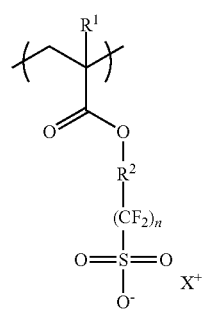

(wherein, $R^1$, $R^2$ and $X^+$ are as defined in the above formula (1); and n is an integer of 1 to 4.)

The polymer (B1) has a function as a radiation-sensitive acid generator that generates an acid upon irradiation with a radioactive ray. Thus, uniform acid diffusion at the light-exposed site can be achieved, whereby favorable pattern formation properties can be exhibited.

$X^+$ in the above formula (3) preferably represents at least one selected from the group consisting of onium cations each represented by the following formulae (1-1) and (1-2):

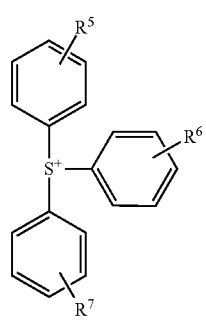

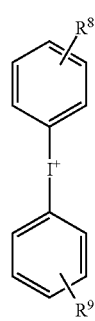

(wherein, $R^5$ to $R^9$ each independently represent a hydrogen atom, a hydroxyl group, a halogen atom, an alkyl group having 1 to 10 carbon atoms which may have a substituent, a cycloalkyl group having 3 to 12 carbon atoms which may have a substituent or an alkoxy group having 1 to 10 carbon atoms which may have a substituent.)

Since the polymer (B1) has the particular onium cation, favorable radioactive ray sensitivity can be provided, whereby efficient generation of the acid is enabled.

It is preferred that the polymer (B1) further has a repeating unit represented by the following formula (2) (hereinafter, may be also referred to as "repeating unit (2)"):

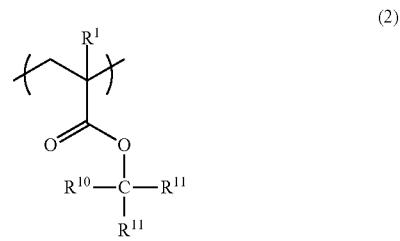

(wherein, $R^1$ is as defined in the above formula (3); $R^{10}$ represents an alkyl group having 1 to 4 carbon atoms or a monovalent alicyclic hydrocarbon group having 4 to 20 carbon atoms; $R^{11}$ each independently represent an alkyl group having 1 to 4 carbon atoms or a monovalent alicyclic hydrocarbon group having 4 to 20 carbon atoms; alternatively, two $R^{11}$ groups may bind with each other to form a bivalent alicyclic hydrocarbon group having 4 to 20 carbon atoms together with carbon atoms to which both $R^{11}$ groups are bound.)

Since the repeating unit (2) has a protecting group that can be removed by an action of the acid (acid-dissociable group), the action of the acid allows the protecting group to be removed and thus alkali solubility can be imparted to the polymer (B1), whereby the developability can be improved.

The radiation-sensitive resin composition may further contain (B2) a radiation-sensitive acid generator (hereinafter, may be also referred to as "acid generator (B2)") in place of or together with the polymer (B1).

In the radiation-sensitive resin composition of the embodiment of the present invention, the polymer (A) preferably has as the repeating unit (I) a repeating unit represented by the following formula (1) (hereinafter, may be also referred to as "repeating unit (1)"):

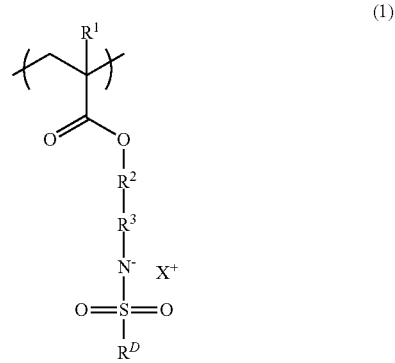

(wherein, $R^1$ represents a hydrogen atom, a methyl group or a trifluoromethyl group; $R^2$ represents a linear or branched bivalent hydrocarbon group having 1 to 10 carbon atoms, a bivalent hydrocarbon group having 3 to 20 carbon atoms which is cyclic or has a cyclic partial structure, or a group derived therefrom by substituting a part or all of hydrogen atoms with a fluorine atom; $R^3$ represents a single bond, a —C(=O)-group, a —O—C(=O)-group or a sulfinyl group; $R^D$ represents a linear or branched monovalent hydrocarbon group having 1 to 10 carbon atoms, a monovalent hydrocarbon group having 3 to 20 carbon atoms which is cyclic or has a cyclic partial structure, or a group derived therefrom by substituting a part or all of hydrogen atoms with a fluorine atom; and $X^+$ represents an onium cation.) (hereinafter, the polymer having the repeating unit (1) may be also referred to as "polymer (A1)").

In the radiation sensitive resin composition of the embodiment of the present invention, the polymer (A) preferably has as the repeating unit represented by the above formula (I) at least one selected from the group consisting of a repeating unit represented by the following formula (21-1) (hereinafter, may be also referred to as "repeating unit (21-1)") and a repeating unit represented by the following formula (21-2) (hereinafter, may be also referred to as "repeating unit (21-2)"):

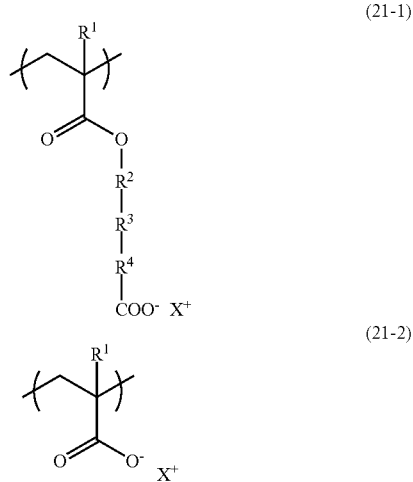

(wherein, $R^1$ represents a hydrogen atom, a methyl group or a trifluoromethyl group; $R^2$ and $R^4$ each independently represent a single bond, a linear or branched bivalent hydrocarbon group having 1 to 10 carbon atoms, a bivalent hydrocarbon group having 3 to 20 carbon atoms which is cyclic or has a cyclic partial structure, or a group derived therefrom by substituting a part or all of hydrogen atoms with a fluorine atom; $R^3$ represents a single bond, a —O— group, a —C(=O)— group, a —C(=O)—O— group or a —O—C(=O)-group (however, $R^2$, $R^3$ and $R^4$ are avoided from all representing a single bond at the same time); and $X^+$ represents an onium cation.)

In the radiation-sensitive resin composition of the embodiment of the present invention, it is preferred that the polymer (A) further has at least one selected from the group consisting of the repeating unit (2) and the repeating unit (3) (hereinafter, the polymer having the repeating unit (I) and the repeating unit (3) may be also referred to as "polymer (A11)"). Note that this polymer (A11) is a polymer having a function as a radiation-sensitive acid generator that generates an acid upon irradiation with a radioactive ray, whereby uniform acid diffusion at the light-exposed site is achieved, and thus favorable pattern formation properties can be exhibited.

Since the polymer of the embodiment of the present invention has the aforementioned repeating unit (I), it serves as a base with respect to the acid generated upon exposure, and then loses basicity by degradation of itself upon irradiation with actinic radiation or a radioactive ray. Accordingly, when the polymer is used in a radiation-sensitive resin composition, the acid is diffused at the light-exposed site, whereas the diffusion of the acid at the light-unexposed site is controlled, and thus a favorable contrast can be provided. Furthermore, since a structure having acid diffusion controllability is present in the polymer, uniform acid diffusion controllability at the light-unexposed site can be exhibited, and thus favorable LWR characteristics and pattern configuration can be attained. Therefore, the polymer of the embodiment of the present invention is suited for the radiation-sensitive resin composition.

The polymer of the embodiment of the present invention preferably contains as the repeating unit (I) the aforementioned repeating unit (1).

The polymer of the embodiment of the present invention preferably has as the repeating unit represented by the above formula (I) at least one selected from the group consisting of a repeating unit represented by the following formula (21-1) and a repeating unit represented by the following formula (21-2).

It is preferred that the polymer of the embodiment of the present invention further has the aforementioned repeating unit (2). Due to having a protecting group that can be removed by an action of the acid (acid-dissociable group), the action of the acid allows the protecting group to be removed, and thus alkali solubility can be imparted to the polymer.

In the polymer of the embodiment of the present invention, $X^+$ in the above formula (I) is preferably at least one selected from the group consisting of onium cations each represented by the above formula (1-1) and the above formula (1-2). Accordingly, the radioactive ray sensitivity of the polymer can be improved.

When the polymer of the embodiment of the present invention further has the aforementioned repeating unit (3), it can function as a radiation-sensitive acid generator that generates an acid upon irradiation with a radioactive ray.

In the polymer, $X^+$ in the above formula (3) is preferably at least one selected from the group consisting of onium cations each represented by the above formula (1-1) and the above formula (1-2). This also can make the radioactive ray sensitivity favorable for generating an acid from the polymer.

The compound of the embodiment of the present invention is represented by the following formula (i) (hereinafter, may be also referred to as "compound (i)"), or the compound represented by the following formula (ii) (hereinafter, may be also referred to as "compound (ii)"):

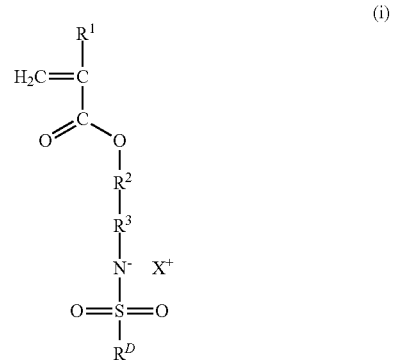

(wherein, $R^1$ represents a hydrogen atom, a methyl group or a trifluoromethyl group; $R^2$ represents a linear or branched bivalent hydrocarbon group having 1 to 10 carbon atoms, a bivalent hydrocarbon group having 3 to 20 carbon atoms which is cyclic or has a cyclic partial structure, or a group derived therefrom by substituting a part or all of hydrogen atoms with a fluorine atom; $R^3$ represents a single bond, a —C(=O)-group, a —O—C(=O)-group or a sulfinyl group; $R^D$ represents a linear or branched monovalent hydrocarbon group having 1 to 10 carbon atoms, a monovalent hydrocarbon group having 3 to 20 carbon atoms which is cyclic or has a cyclic partial structure, or a group derived therefrom by substituting a part or all of hydrogen atoms with a fluorine atom; and $X^+$ represents an onium cation.)

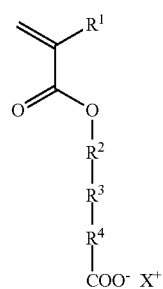

(ii)

(wherein, $R^1$ represents a hydrogen atom, a methyl group or a trifluoromethyl group; $R^2$ and $R^4$ each independently represent a single bond, a linear or branched bivalent hydrocarbon group having 1 to 10 carbon atoms, a bivalent hydrocarbon group having 3 to 20 carbon atoms which is cyclic or has a cyclic partial structure, or a group derived therefrom by substituting a part or all of hydrogen atoms with a fluorine atom; $R^3$ represents a single bond, a —O— group, a —C(=O)— group, a —C(=O)—O— group or a —O—C(=O)-group (however, $R^2$, $R^3$ and $R^4$ are avoided from all representing a single bond at the same time); and $X^+$ represents an onium cation.)

The sulfonamide structure or the carboxylate anion structure of the compound loses basicity by degradation upon irradiation with a radioactive ray, whereas the basicity is maintained as long as it is not irradiated therewith. When a polymer formed with such a compound is used in a radiation-sensitive resin composition, a favorable contrast is provided since the acid is diffused at the light-exposed site, whereas diffusion of the acid is controlled at the light-unexposed site. Furthermore, due to the presence of the structure having acid diffusion controllability in the polymer, uniform acid diffusion controllability at the light-unexposed site is exhibited, whereby favorable LWR characteristics and pattern configuration can be obtained. Therefore, the compound of the embodiment of the present invention is suited for producing the polymer.

The radiation-sensitive resin composition of the embodiment of the present invention has an effect of capable of forming a resist pattern that has small LWR and has superior pattern configuration. The polymer and the compound of the embodiment of the present invention are suitably used as a basic material of the radiation-sensitive resin composition of the embodiment of the present invention.

Preferred embodiments of the present invention are explained in more detail below, but the present invention is not limited in any respect to the following embodiments. It should be construed that the present invention encompasses any appropriate modifications, variations and the like of the following embodiments based on common knowledge of persons skilled in the art in the scope without departing from the spirit of the present invention.

<Radiation-Sensitive Resin Composition>

The radiation-sensitive resin composition of the embodiment of the present invention contains a polymer (A) having a repeating unit (I), and preferably, at least one selected from the group consisting of the polymer (B1) having a repeating unit (3) and the acid generator (B2). The repeating unit (3) has a function similar to that of the acid generator (B2), i.e., generation of an acid upon irradiation with a radioactive ray. Suitable embodiments of the polymer (A) include a polymer (A1) having a repeating unit (1) as the repeating unit (I), a polymer (A11) that is a copolymer having a repeating unit (I) and a repeating unit (3). The radiation-sensitive resin composition of the embodiment of the present invention also includes a radiation-sensitive resin composition containing the polymer (A1) and the polymer (A11) in addition to the composition containing these polymers. The polymer (A), the polymer (B1) as an acid generator and the acid generator (B2), as well as the polymer (A11) that is a suitable embodiment of the polymer (A), and other suitable polymers are explained below.

<Polymer (A)>

The polymer (A) constituting the radiation-sensitive resin composition of the embodiment of the present invention has a repeating unit (I), and corresponds to the polymer of the embodiment of the present invention. The repeating unit (I) has a sulfonamide structure, a carboxylate anion structure and a sulfonate anion structure each having an onium salt as a cation. Any of the structures serves as a base with respect to the acid generated in an exposure step in the case in which the radiation-sensitive resin composition includes at least one selected from the group consisting of the polymer (B1) and the acid generator (B); however, the basicity is lost by degradation upon irradiation with actinic radiation or a radioactive ray. Thus, the radiation-sensitive resin composition containing the polymer (A) provides a favorable contrast since the acid is diffused at the light-exposed site, whereas the acid diffusion at the light-unexposed site is controlled. Still further, due to the presence of the structure having acid diffusion controllability in the polymer, uniform acid diffusion controllability at the light-unexposed site is exhibited. Thus, superior effects capable of providing particularly favorable LWR characteristics and pattern configuration, which effects being characteristic in the present application can be achieved.

The polymer (A) is preferably alkali-insoluble or hardly soluble in alkali but has a protecting group that can be removed by an action of the acid (acid-dissociable group) to have alkali solubility (hereinafter, the polymer (A) may be also referred to as "acid-dissociable polymer"). Suitable repeating unit having an acid-dissociable group is exemplified by a repeating unit (2).

The repeating unit (1) in the polymer (A) preferably generates a weak acid having a pKa of about 3 to 8 upon exposure, and the acid-dissociable group in the polymer (A), preferably the acid-dissociable group in the repeating unit (2) has a structure that can avoid dissociation of the protecting group with such a weak acid. On the other hand, the acid generated from the aforementioned acid generator (B2) and the repeating unit (3) upon exposure preferably has a pKa of 2 or less, and when the acid is diffused, the diffusion is suppressed by ion exchange with the repeating unit (1) in the polymer (A) undegraded. In other words, degradation of the repeating unit (I) in the polymer (A) results in loss of basicity with respect to the acid generated from the acid generator (B2) or the repeating unit (3) in portions irradiated with actinic radiation or a radioactive ray; however, in unirradiated portion the ion exchange action leads to a function of suppressing diffusion of the acid generated from the acid generator (B2) or the repeating unit (3). As a result, a favorable contrast between the irradiated portions and the unirradiated portions can be provided.

(Repeating Unit (I))

In the above formula (I), $R^1$ represents a hydrogen atom, a methyl group or a trifluoromethyl group, and preferably a hydrogen atom or a methyl group. Examples of the group represented by $R^2$ and $R^4$ include linear or branched bivalent hydrocarbon groups having 1 to 10 carbon atoms such as a methylene group, an ethylene group, an isopropylene group, a n-butylene group, a n-pentylene group, a n-hexylene group, a n-heptylene group and a n-octylene group; and bivalent hydrocarbon groups having 3 to 20 carbon atoms which are cyclic or have a cyclic partial structure, being hydrocarbons such as cyclopropane, cyclobutane, cyclopentane, cyclohexane, dicyclopentane, norbornane, tricyclodecane, tetracyclododecane and adamantane from which two hydrogen atoms were removed, and groups derived therefrom by substituting a part or all of hydrogen atoms in these groups with a fluorine atom. $R^3$ represents a single bond, a —C(=O)-group, a —O—C(=O)-group or a sulfinyl group. Examples of the group represented by $R^4$ include linear or branched monovalent hydrocarbon group having 1 to 10 carbon atoms such as a methyl group, an ethyl group, an isopropyl group, a n-butyl group, a n-pentyl group, a n-hexyl group, a n-heptyl group and a n-octyl group; and monovalent hydrocarbon groups having 3 to 20 carbon atoms which are cyclic or have a cyclic partial structure, being hydrocarbons such as cyclopropane, cyclobutane, cyclopentane, cyclohexane, dicyclopentane, norbornane, tricyclodecane, tetracyclododecane and adamantane from which one hydrogen atom was removed, and groups derived therefrom by substituting a part or all of hydrogen atoms in these groups with a fluorine atom. Among these, fluoridized alkyl groups, particularly perfluoroalkyl groups such as a trifluoromethyl group, a pentafluoroethyl group and a heptafluoropropyl group are preferably used.

Specific examples of preferred repeating unit (I) include the repeating unit (1), repeating unit (21) and repeating unit (31) described later, and of these, the repeating unit (1) is particularly preferred.

(Repeating Unit (1))

In the above formula (1), $R^1$ represents a hydrogen atom, a methyl group or a trifluoromethyl group, and preferably a hydrogen atom or a methyl group. Examples of the group represented by $R^2$ include linear or branched monovalent hydrocarbon groups having 1 to 10 carbon atoms such as a methyl group, an ethyl group, an isopropyl group, a n-butyl group, a n-pentyl group, a n-hexyl group, a n-heptyl group and a n-octyl group; and bivalent hydrocarbon groups having 3 to 20 carbon atoms which are cyclic or have a cyclic partial structure, being hydrocarbons such as cyclopropane, cyclobutane, cyclopentane, cyclohexane, dicyclopentane, norbornane, tricyclodecane, tetracyclododecane and adamantane from which two hydrogen atoms were removed, and groups derived therefrom by substituting a part or all hydrogen atoms with a fluorine atom. $R^3$ represents a single bond, a —C(=O)-group, a —O—C(=O)-group or a sulfinyl group. Examples of the group represented by $R^4$ include linear or branched monovalent hydrocarbon groups having 1 to 10 carbon atoms such as a methyl group, an ethyl group, an isopropyl group, a n-butyl group, a n-pentyl group, a n-hexyl group, a n-heptyl group and a n-octyl group; monovalent hydrocarbon groups having 3 to 20 carbon atoms which are cyclic or have a cyclic partial structure, being hydrocarbons such as cyclopropane, cyclobutane, cyclopentane, cyclohexane, dicyclopentane, norbornane, tricyclodecane, tetracyclododecane and adamantane from which one hydrogen atom was removed, and groups derived therefrom by substituting a part or all of hydrogen atoms in these groups with a fluorine atom. Among these, alkyl fluoride groups, particularly perfluoroalkyl groups such as a trifluoromethyl group, a pentafluoroethyl group and a heptafluoropropyl group are preferably used.

The monomer which may be used for obtaining the repeating unit (1) includes the compound of the embodiment of the present invention represented by the above formula (i). Specific examples of the compound preferred include those represented by the following formulas (i-1) to (i-14). Of these, a compound in which $R^1$ represents a hydrogen atom or a methyl group may be preferably used.

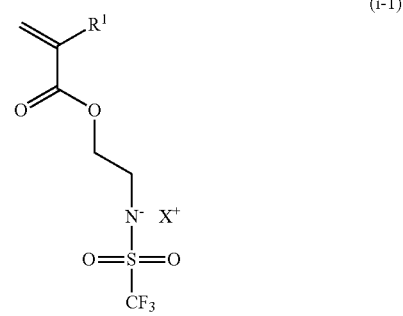

(i-1)

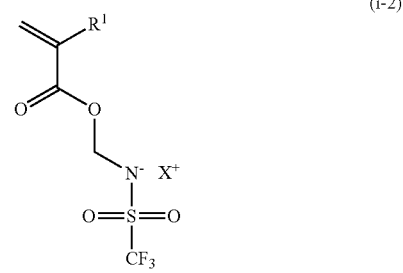

(i-2)

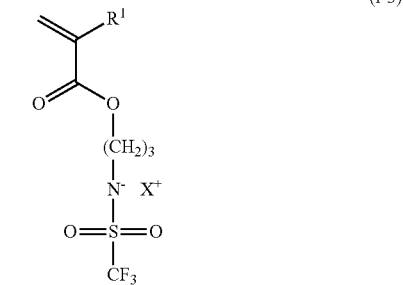

(i-3)

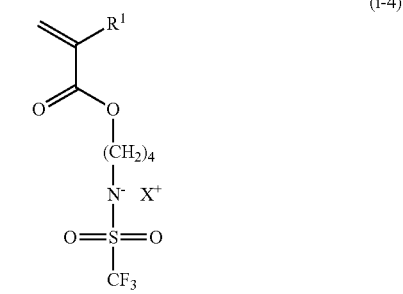

(i-4)

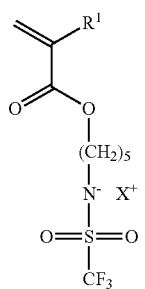 (i-5)
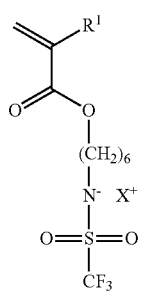 (i-6)
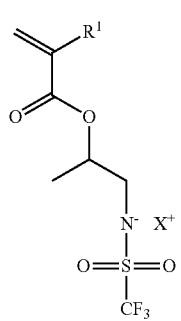 (i-7)
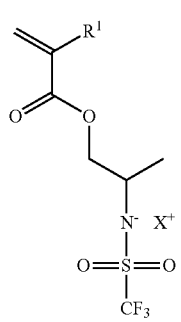 (i-8)
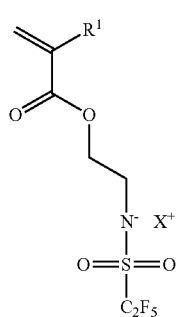 (i-9)
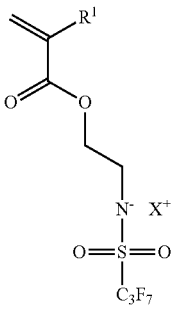 (i-10)
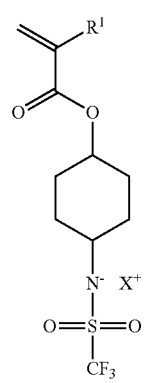 (i-11)
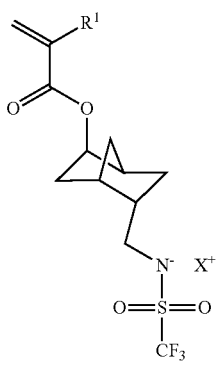 (i-12)
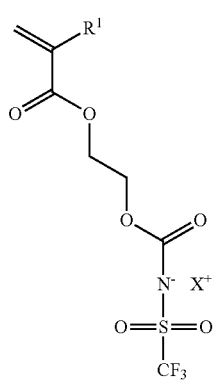 (i-13)

(i-14)

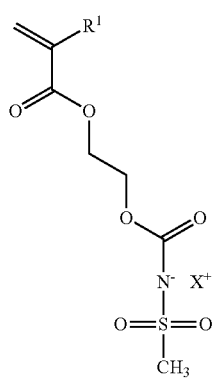

In the formulae, $R^1$ and $X^+$ are as defined in the above formula (1).

The onium cation represented by $X^+$ is preferably at least one selected from those represented by the above formulae (1-1) and (1-2).

Examples of the sulfonium cation represented by the above formula (1-1) include cations represented by the following formulae (j-1) to (j-22). In addition, examples of the iodonium cation represented by the above formula (1-2) include cations represented by the following formulae (k-1) to (k-25).

(j-1)

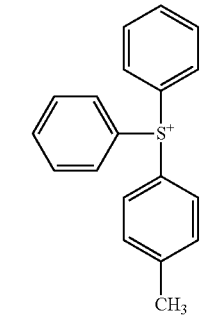

(j-2)

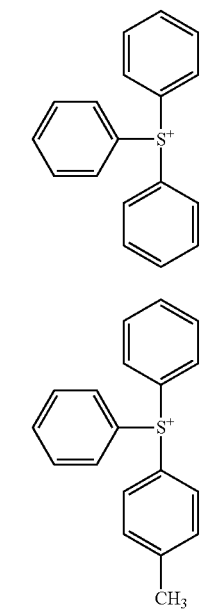

(j-3)

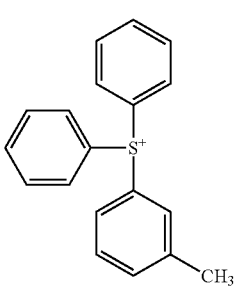

(j-4)

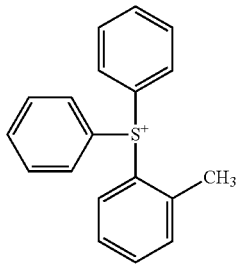

(j-5)

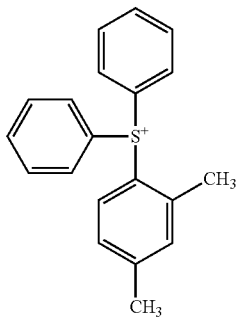

(j-6)

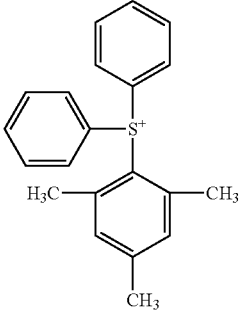

(j-7)

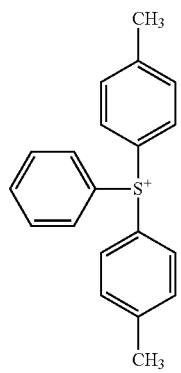

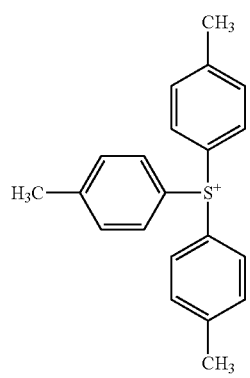 (j-8)
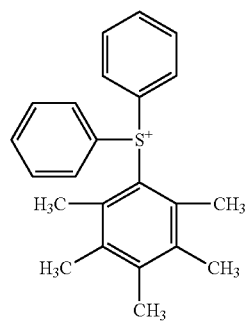 (j-9)
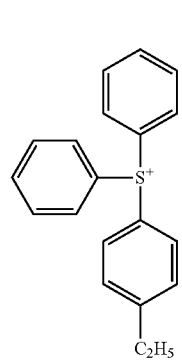 (j-10)
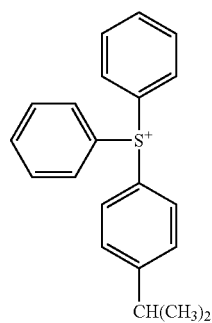 (j-11)
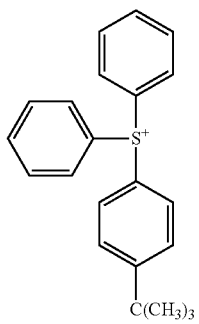 (j-12)
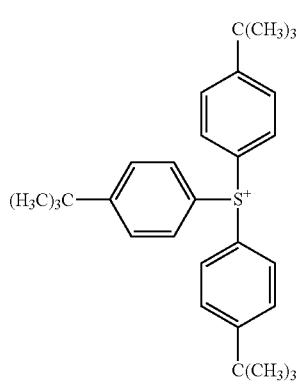 (j-13)
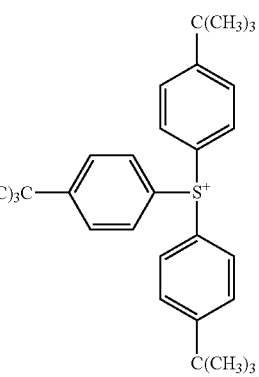 (j-14)
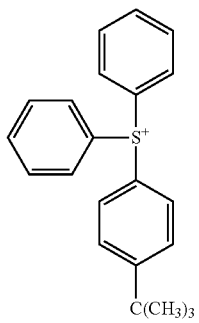 (j-15)

(j-16)
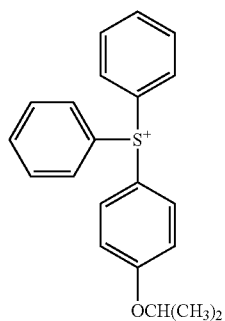
(j-17)
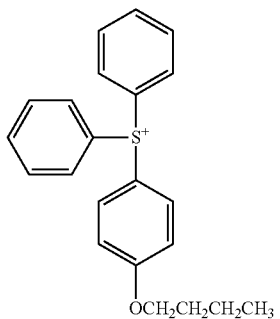
(j-18)
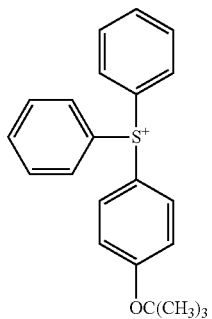
(j-19)
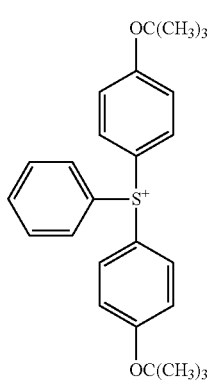
(j-20)
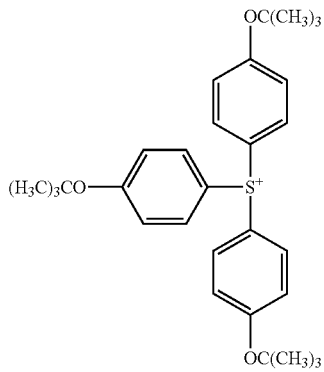
(j-21)
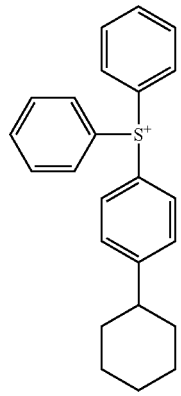
(j-22)
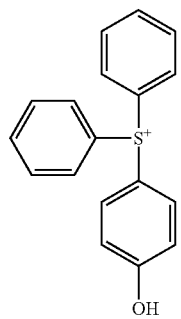
(k-1)
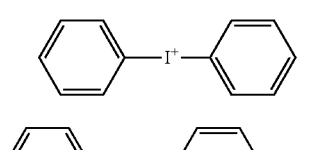
(k-2)
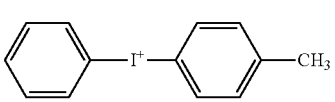
(k-3)
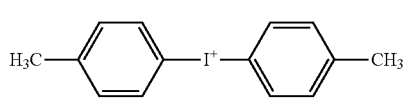
(k-4)
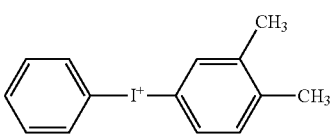

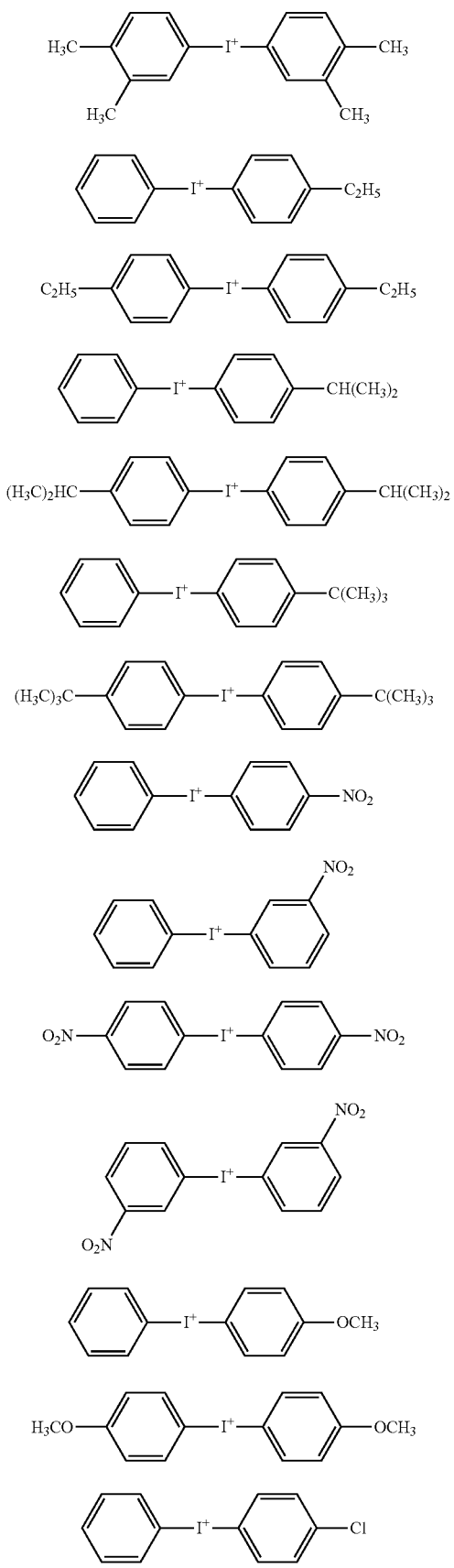
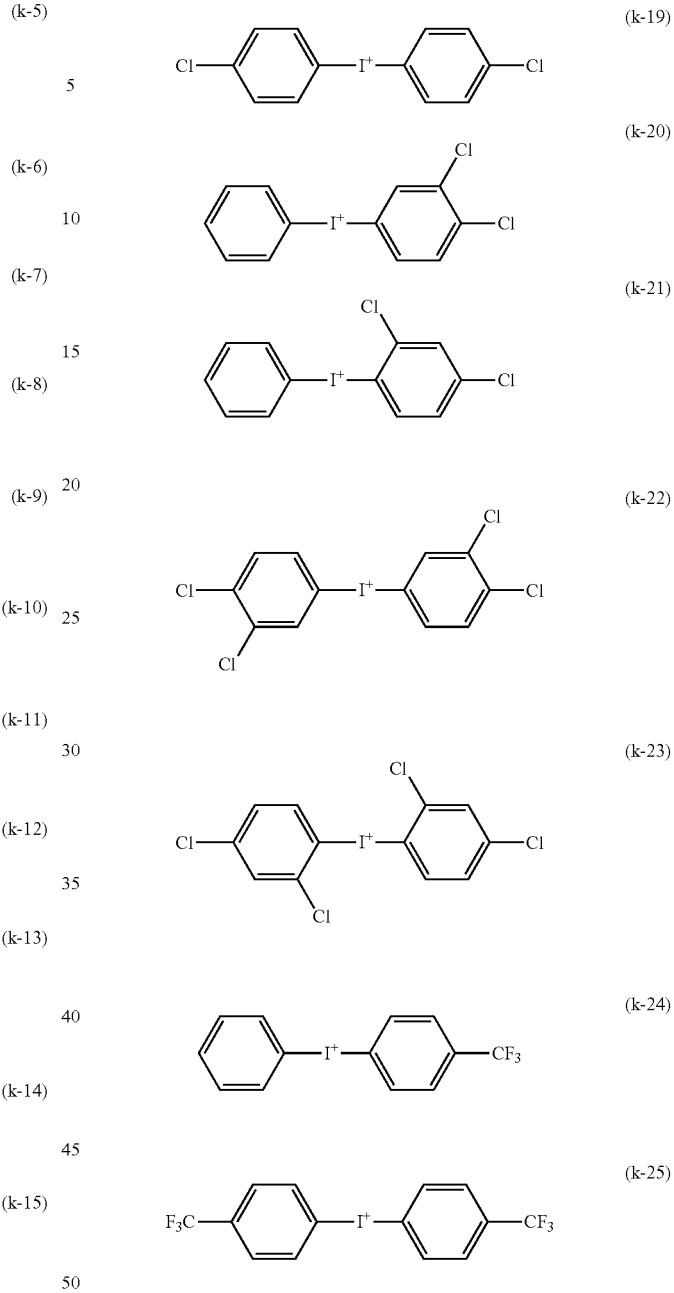

The above monovalent onium cation represented by $X^+$ in the above formula (1) may be produced according to a general method described in, for example, Advances in Polymer Science, Vol. 62, p. 1-48 (1984). Also, the compound of the embodiment of the present invention may be generally synthesized by replacing an active proton of a sulfonamide compound with an onium cation by ion exchange.

(Repeating Unit (21))

The polymer (A) may have as the repeating unit represented by the above formula (I) at least one selected from the group consisting of a repeating unit represented by the following formula (21-1) and a repeating unit represented by the following formula (21-2) (hereinafter, the repeating units (21-1) and (21-2) may be correctively referred to as "repeating unit (21)"):

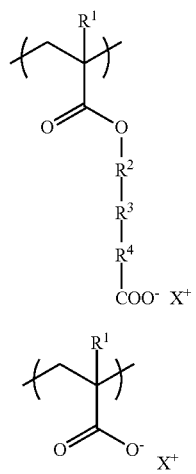

(21-1)

(21-2)

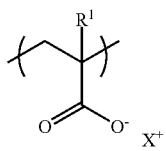

(wherein, $R^1$ represents a hydrogen atom, a methyl group or a trifluoromethyl group; $R^2$ and $R^4$ each independently represent a single bond, a linear or branched bivalent hydrocarbon group having 1 to 10 carbon atoms, a bivalent hydrocarbon group having 3 to 20 carbon atoms which is cyclic or has a cyclic partial structure, or a group derived therefrom by substituting a part or all of hydrogen atoms with a fluorine atom; $R^3$ represents a single bond, a —O— group, a —C(=O)— group, a —C(=O)—O— group or a —O—C(=O)-group (however, $R^2$, $R^3$ and $R^4$ are avoided from all representing a single bond at the same time); and $X^+$ represents an onium cation (hereinafter, the polymer having the repeating unit (21) may be also referred to as "polymer (A21)")).

In the above formulae (21-1) and (21-2), $R^1$ represents a hydrogen atom, a methyl group or a trifluoromethyl group, and preferably a hydrogen atom or a methyl group. Examples of the group represented by $R^2$ and $R^4$ in the above formula (21-1) include a single bond; linear or branched bivalent hydrocarbon groups having 1 to 10 carbon atoms such as a methylene group, an ethylene group, an isopropylene group, a n-butylene group, a n-pentylene group, a n-hexylene group, a n-heptylene group and n-octylene group; bivalent hydrocarbon groups having 3 to 20 carbon atoms which are cyclic or have a cyclic partial structure, being hydrocarbons such as cyclopropane, cyclobutane, cyclopentane, cyclohexane, dicyclopentane, norbornane, tricyclodecane, tetracyclododecane and adamantane from which two hydrogen atoms were removed, and groups derived therefrom by substituting a part or all of hydrogen atoms in these groups with a fluorine atom. Of these, linear alkylene groups having 1 to 4 carbon atoms, and cyclic hydrocarbon groups being cyclohexane, norbornane and adamantane from which two hydrogen atoms were removed are preferred. $R^3$ in the above formula (1-1) represents a single bond, or a —O— group, a —C(=O)— group, a —C(=O)—O— group or a —O—C(=O)-group. However, $R^2$, $R^3$ and $R^4$ are avoided from all representing a single bond at the same time.

As a monomer used for obtaining the repeating unit (21-1), the compound of embodiment of the present invention represented by the following formula (ii) may be used, and acrylic acid may be used as a monomer used for obtaining the repeating unit (21-1):

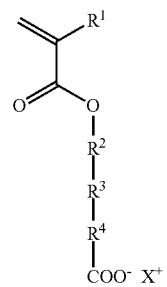

(ii)

(wherein, $R^1$ to $R^4$ and $X^+$ are as defined in the above formula (21-1).)

Specific examples of the compound (ii) preferred include compounds represented by the following formulae (ii-1) to (ii-17). Of these, a compound in which $R^1$ represents a hydrogen atom or a methyl group is preferably used.

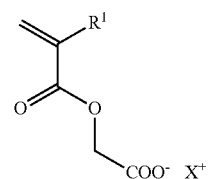

(ii-1)

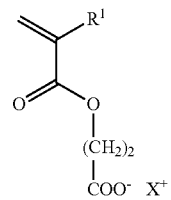

(ii-2)

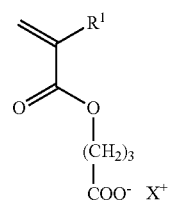

(ii-3)

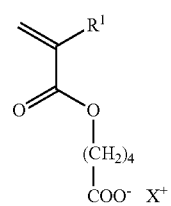

(ii-4)

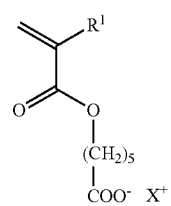

(ii-5)

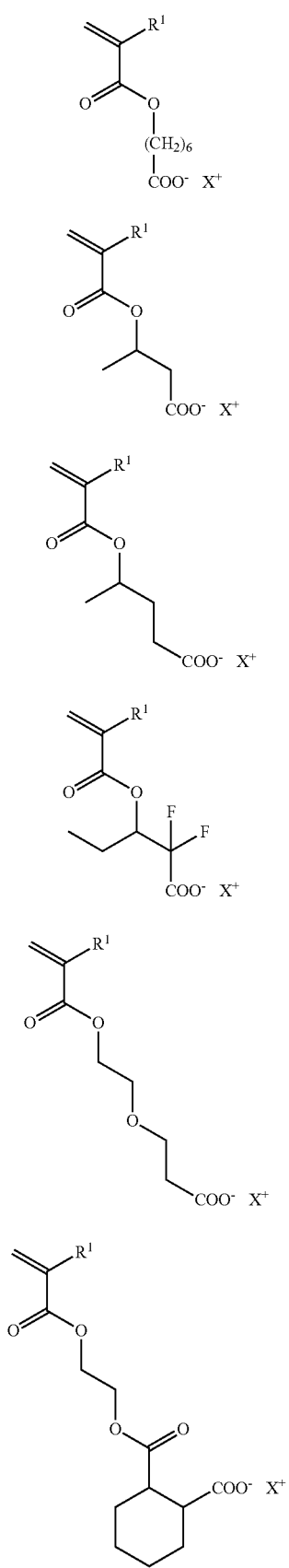
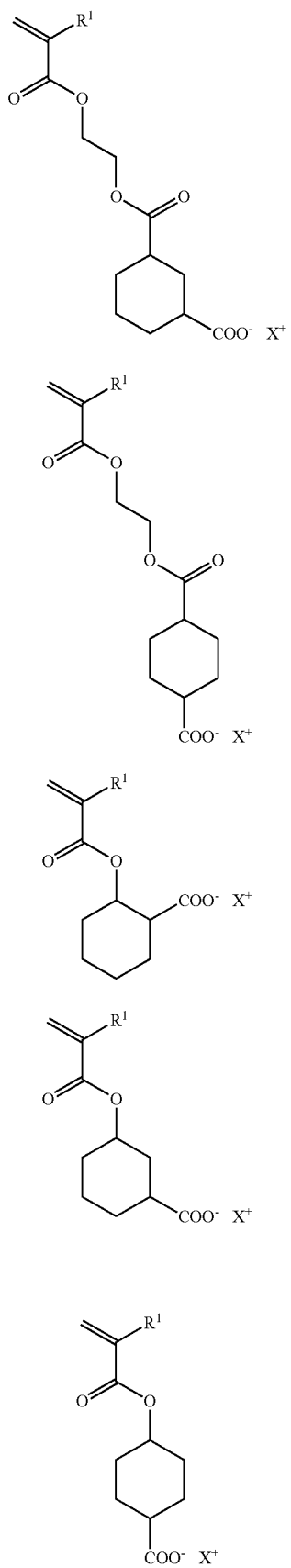

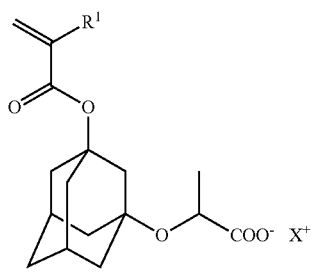

(ii-17)

In the formula, $R^1$ and $X^+$ are as defined in the above formula (21-1).

The onium cation represented by $X^+$ is preferably at least one selected from those represented by the above formulae (1-1) and (1-2).

As the sulfonium cation represented by the above formula (1-1), a cation represented by the above formulae (j-1) to (j-22) may be suitably used. Also, as the iodonium cation represented by the above formula (1-2), the cation represented by the above formulae (k-1) to (k-25) may be suitably used.

In general, the compound (ii) may be synthesized by replacing an active proton at a carboxylic acid site with an onium cation by ion exchange.

The polymer (A21) usually has other repeating unit. Suitable other repeating unit may be exemplified by the repeating unit (2) described later and other repeating unit.

The proportion of the repeating unit (21) in the polymer (A21) is preferably 0.1 to 20% by mole, and particularly preferably 0.1 to 10% by mole with respect to all repeating units. When the proportion of the repeating unit (21) is less than 0.1% by mole, the effect of adjusting the pattern configuration, reduction of LWR and the like may be insufficient. In contrast, when the proportion exceeds 20% by mole, problems of defective shape due to lowered sensitivity or transmission impairment are likely to occur.

Also, when the polymer (A21) has the repeating unit (2), the proportion of the repeating unit (2) with respect to all repeating units is preferably 20 to 80% by mole, and particularly preferably 25 to 75% by mole. The proportion being less than 20% by mole leads to failure in obtaining sufficient solubility, whereby the resolving ability can be deteriorated. In contrast, when the proportion exceeds 80% by mole, the adhesiveness with the substrate may be impaired.

In the radiation-sensitive resin composition containing the polymer (A21), at least one polymer selected from the group consisting of the polymer (A1), the polymer (A11) and the polymer (B1) may further have the repeating unit (21), and the polymer (A21) may be used in combination with at least one polymer selected from the group consisting of the polymer (A1), the polymer (A11) and the polymer (B1).

(Repeating Unit (31))

The polymer (A) may have as the repeating unit represented by the above formula (I) the repeating unit represented by the following formula (31) (hereinafter, may be also referred to as "repeating unit (31)", the polymer having the repeating unit (31) may be also referred to as "polymer (A31)"):

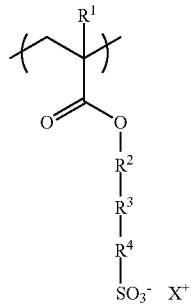

(31)

(wherein, $R^1$ represents a hydrogen atom, a methyl group or a trifluoromethyl group; $R^2$ represents a single bond, a linear or branched bivalent hydrocarbon group having 1 to 10 carbon atoms, a bivalent hydrocarbon group having 3 to 20 carbon atoms which is cyclic or has a cyclic partial structure, or a group derived therefrom by substituting a part or all of hydrogen atoms with a fluorine atom; $R^3$ represents a single bond or a bivalent group represented by —O—, —C(=O)—, —C(=O)—O— or —O—C(=O)—; $R^4$ represents a linear or branched bivalent hydrocarbon group having 1 to 10 carbon atoms, a bivalent hydrocarbon group having 3 to 20 carbon atoms which is cyclic or has a cyclic partial structure; and $X^+$ represents an onium cation.)

In the above formula (31), $R^1$ represents a hydrogen atom, a methyl group or a trifluoromethyl group, and in particular a hydrogen atom or a methyl group is preferred. Examples of the linear or branched bivalent hydrocarbon group having 1 to 10 carbon atoms represented by $R^2$ and $R^4$ in the above formula (1) include a methylene group, an ethylene group, an isopropylene group, a n-butylene group, a n-pentylene group, a n-hexylene group, a n-heptylene group, a n-octylene group and the like, whereas examples of the bivalent hydrocarbon group having 3 to 20 carbon atoms which is cyclic or has a cyclic partial structure include groups in the form of alicyclic hydrocarbons such as cyclopropane, cyclobutane, cyclopentane, cyclohexane, dicyclopentane, norbornane, tricyclodecane, tetracyclododecane and adamantane from which two hydrogen atoms were removed. Of these, linear alkylene groups having 1 to 4 carbon atoms, and cyclic hydrocarbon groups in the form of cyclohexane, norbornane or adamantane from which two hydrogen atom were removed are preferred. Also, the group represented by $R^2$ may be a group in which a part or all of hydrogen atoms are substituted with a fluorine atom.

As a monomer used for obtaining the repeating unit (31), the compound represented by the following formula (iii) (hereinafter, may be also referred to as "compound (iii)") may be used.

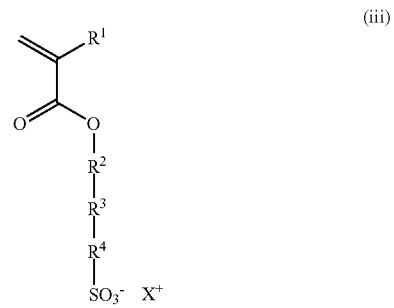

(iii)

In the formula (iii), $R^1$ to $R^4$ and $X^+$ are as defined in the above formula (31).

Specific examples of the compound preferred include compounds represented by the following formulae (iii-1) to (iii-11). Of these, compounds wherein $R^1$ represents as hydrogen atom or a methyl group are preferably used.

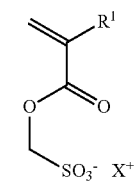
(iii-1)

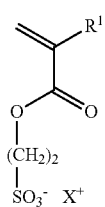
(iii-2)

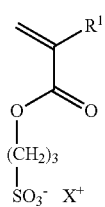
(iii-3)

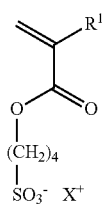
(iii-4)

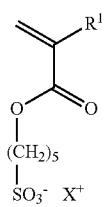
(iii-5)

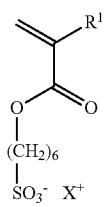
(iii-6)

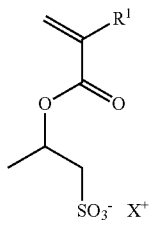
(iii-7)

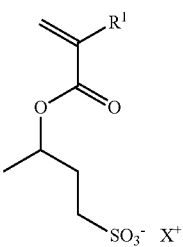
(iii-8)

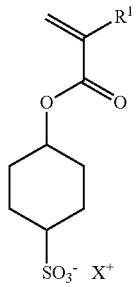
(iii-9)

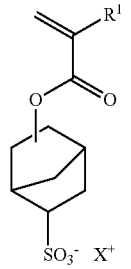
(iii-10)

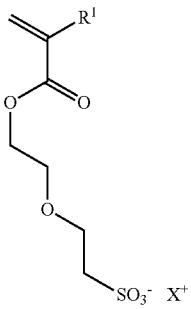
(iii-11)

In the formula, $R^1$ and $X^+$ are as defined in the above formula (31).

The onium cation represented by $X^+$ is preferably at least one selected from those represented by the above formulae (1-1) and (1-2).

As the sulfonium cation represented by the above formula (1-1), cations represented by the above formulae (j-1) to (j-22) may be suitably used. Also, as the iodonium cation represented by the above formula (1-2), cations represented by the above formulae (k-1) to (k-25) may be suitably used.

In general, the compound of the embodiment of the present invention may be synthesized by replacing an active proton at a carboxylic acid site with an onium cation by ion exchange.

The proportion of the repeating unit (31) in the polymer (A31) is preferably 0.1 to 20% by mole, and particularly preferably 0.1 to 10% by mole with respect to all repeating units. When the proportion of the repeating unit (31) is less than 0.1% by mole, the effect of adjusting the pattern configuration, reduction of LWR and the like may be insufficient.

In contrast, when the proportion exceeds 20% by mole, problems of defective shape due to lowered sensitivity or transmission impairment are likely to occur.

Also, when the polymer (A31) has the repeating unit (2), the proportion of the repeating unit (2) with respect to all repeating units is preferably 20 to 80% by mole, and particularly preferably 25 to 75% by mole. The proportion being less than 20% by mole leads to failure in obtaining sufficient solubility, whereby the resolving ability can be deteriorated. In contrast, when the proportion exceeds 80% by mole, the adhesiveness with the substrate may be impaired.

In the radiation-sensitive resin composition containing the polymer (31), at least one polymer selected from the group consisting of the polymer (A1), the polymer (A11) and the polymer (B1) may further have the repeating unit (31), and the polymer (A31) may be used in combination with at least one polymer selected from the group consisting of the polymer (A1), the polymer (A11) and the polymer (B1).

<Polymer (A11)>

The polymer (A11) is a copolymer having the repeating unit (I) and the repeating unit (3). In other words, the polymer (A11) is the polymer of the embodiment of the present invention having both an acid diffusion suppressing function exerted by the repeating unit (I), and a radiation-sensitive acid generating function exerted by the repeating unit (3). Therefore, the radiation-sensitive resin composition containing the polymer (A11) may not contain the polymer (B1) and the acid generator (B2) as essential components.

The proportion of the repeating unit (3) in the polymer (A11) is preferably 0.1 to 20% by mole, and particularly preferably 0.1 to 10% by mole with respect to all repeating units in the acid-dissociable polymer included in the radiation-sensitive resin composition. When this proportion is less than 0.1% by mole, the effect of adjusting the pattern configuration, reduction of LWR and the like may be insufficient. In contrast, when the proportion exceeds 20% by mole, problems of defective shape due to insufficient exposure latitude (insufficient EL margin) or transmission impairment are likely to occur.

The polymer (A11) usually has other repeating unit. Suitable other repeating unit may be exemplified by the repeating unit (2) described later and other repeating unit.

As described above, the polymer (A) generally has other repeating unit. Examples of suitable other repeating unit include the repeating unit (2) in the polymer (B1) described later, and the other repeating unit.

It is to be noted that the radiation-sensitive resin composition of the embodiment of the present invention may contain two or more types of polymers (A) having each different copolymerization ratio and molecular weight, or may also contain the polymer (B1) or other acid-dissociable polymer. The repeating unit constituting the other acid-dissociable polymer is exemplified by the repeating unit (2) described later and other repeating unit.

The proportion of the repeating unit (1) in the polymer (A) is preferably 0.1 to 20% by mole, and particularly preferably 0.1 to 10% by mole with respect to all repeating units in the acid-dissociable polymer included in the radiation-sensitive resin composition. When this proportion is less than 0.1% by mole, the effect of adjusting the pattern configuration, reduction of LWR and the like may be insufficient. In contrast, when the proportion exceeds 20% by mole, problems of defective shape due to lowered sensitivity or transmission impairment are likely to occur.

Also, when the polymer (A) has the repeating unit (2), the proportion of the repeating unit (2) in the acid-dissociable polymer included in the radiation-sensitive resin composition with respect to all repeating units is preferably 20 to 80% by mole, and particularly preferably 25 to 75% by mole. The proportion being less than 20% by mole leads to failure in obtaining sufficient solubility, whereby the resolving ability can be deteriorated. In contrast, when the proportion exceeds 80% by mole, the adhesiveness with the substrate may be impaired.

<Polymer (B1)>

The polymer (B1) is a polymer having the repeating unit (3). polymer (B1) has a function as a radiation-sensitive acid generator that generates an acid upon irradiation with a radioactive ray; therefore, when the radiation-sensitive resin composition contains the polymer (B1), the acid generator (B2) may not be contained as an essential component.

(Repeating Unit (3))

In the above formula (3), $R^1$, $R^2$ and $X^+$ are as defined in the above formula (1), and $X^+$ is preferably at least one selected from those represented by the above formula (1-1) and the above formula (1-2), similarly to the repeating unit (1). Also, n is an integer of 1 to 4, and is particularly preferably 2.

Examples of preferable monomer which may be used for obtaining the repeating unit (3) include those represented by the following formulae (3-1) to (3-7). Of these, compounds in which $R^1$ represents a hydrogen atom or a methyl group are preferably used.

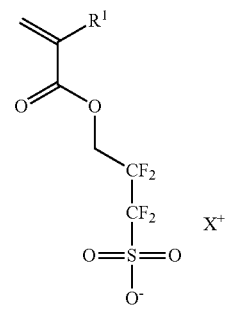

(3-1)

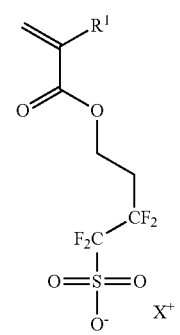

(3-2)

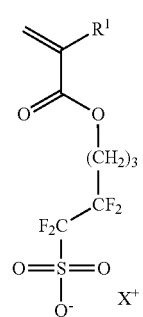

(3-3)

(3-4)
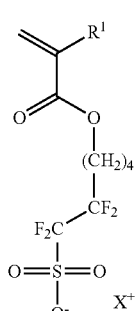

(3-5)
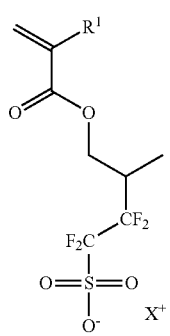

(3-6)
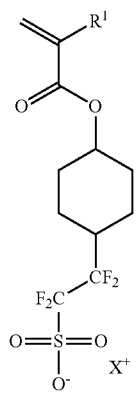

(3-7)
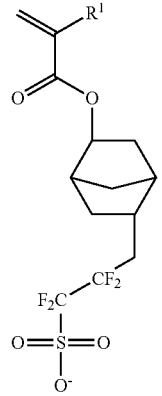

(Repeating Unit (2))

It is preferred that the polymer (B1) further contains the repeating unit (2). The repeating unit (2) has a protecting group that can be removed by an action of the acid (acid-dissociable group), and has a function of removing the protecting group due to the action of the acid, and thus alkali solubility can be imparted to the polymer (B1).

In the above formula (2), examples of the alkyl group having 1 to 4 carbon atoms represented by $R^{10}$ and $R^{11}$ include a methyl group, an ethyl group, a n-propyl group, an isopropyl group, a n-butyl group, a 2-methylpropyl group, a 1-methylpropyl group, a t-butyl group, and the like. Also, examples of the monovalent alicyclic hydrocarbon group having 4 to 20 carbon atoms represented by $R^{10}$ and $R^{11}$ include cycloalkyl groups such as a cyclobutyl group, a cyclopentyl group, a cyclohexyl group, a cycloheptyl group, and a cyclooctyl group; groups having a bridged alicyclic skeleton such as a dicyclopentanyl group, a dicyclopentenyl group, a tricyclodecyl group, a tetracyclododecyl group and an adamantyl group, and the like. Still further, examples of the bivalent alicyclic hydrocarbon group having 4 to 20 carbon atoms formed with two $R^{11}$ groups bound with each other together with carbon atoms to which both $R^{11}$ groups are bound include groups being the aforementioned monovalent alicyclic hydrocarbon groups from which one hydrogen atom was removed.

Examples of preferable repeating unit (2) include those represented by the following formulae (2-1) to (2-9):

(2-1)
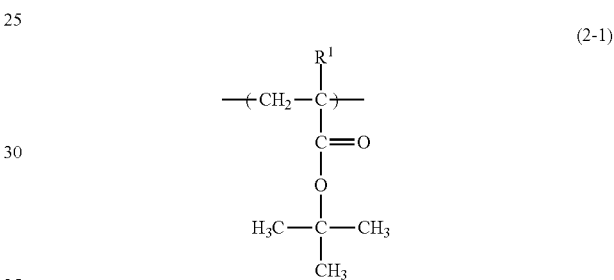

(2-2)
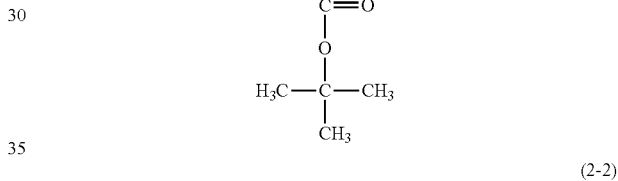

(2-3)
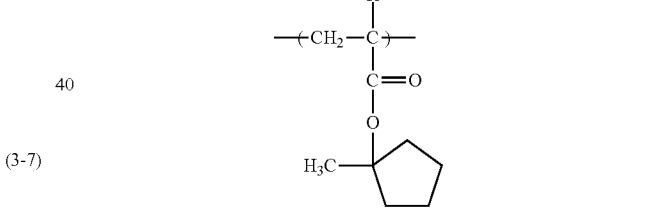

(2-4)
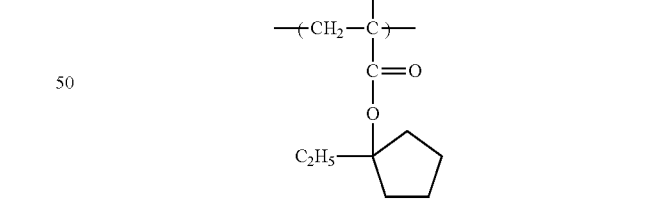

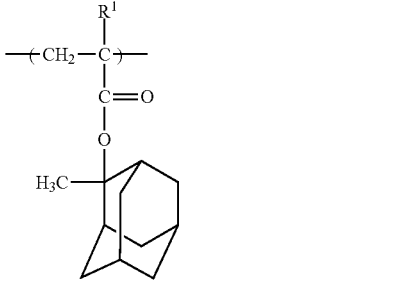

-continued (2-5)
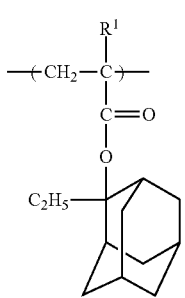

(2-6)
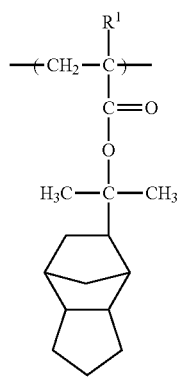

(2-7)
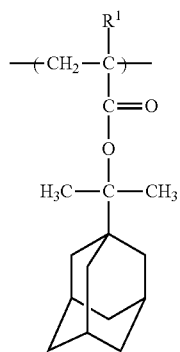

(2-8)
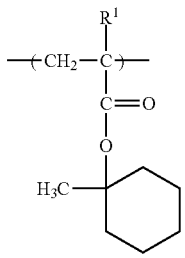

(2-9)
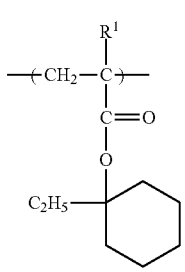

(wherein, $R^1$ is as defined in the above formula (1).)

The polymer (B1) may further have other repeating units, and preferably, may further have at least one selected from the group consisting of a repeating unit having a lactone skeleton and a repeating unit having a cyclic carbonate structure.

Examples of the repeating unit having a lactone skeleton include repeating units derived from compounds such as (meth)acrylic acid-5-oxo-4-oxa-tricyclo[4.2.1.0$^{3,7}$]nona-2-yl ester, (meth)acrylic acid-9-methoxycarbonyl-5-oxo-4-oxa-tricyclo[4.2.1.0$^{3,7}$]nona-2-yl ester, (meth)acrylic acid-5-oxo-4-oxa-tricyclo[5.2.1.0$^{3,8}$]deca-2-yl ester, (meth)acrylic acid-10-methoxycarbonyl-5-oxo-4-oxa-tricyclo[5.2.1.0$^{3,8}$] nona-2-yl ester, (meth)acrylic acid-6-oxo-7-oxa-bicyclo [3.2.1]octa-2-yl ester, (meth)acrylic acid-4-methoxycarbonyl-6-oxo-7-oxa-bicyclo[3.2.1]octa-2-yl ester, (meth)acrylic acid-7-oxo-8-oxa-bicyclo[3.3.1]nona-2-yl ester, (meth) acrylic acid-4-methoxycarbonyl-7-oxo-8-oxa-bicyclo[3.3.1] nona-2-yl ester, (meth)acrylic acid-2-oxotetrahydropyran-4-yl ester, (meth)acrylic acid-4-methyl-2-oxotetrahydropyran-4-yl ester, (meth)acrylic acid-4-ethyl-2-oxotetrahydropyran-4-yl ester, (meth)acrylic acid-4-propyl-2-oxotetrahydropyran-4-yl ester, (meth)acrylic acid-5-oxotetrahydrofuran-3-yl ester, (meth)acrylic acid-2,2-dimethyl-5-oxotetrahydrofuran-3-yl ester, (meth)acrylic acid-4,4-dimethyl-5-oxotetrahydrofuran-3-yl ester, (meth) acrylic acid-2-oxotetrahydrofuran-3-yl ester, (meth)acrylic acid-4,4-dimethyl-2-oxotetrahydrofuran-3-yl ester, (meth) acrylic acid-5,5-dimethyl-2-oxotetrahydrofuran-3-yl ester, (meth)acrylic acid-5-oxotetrahydrofuran-2-ylmethyl ester, (meth)acrylic acid-3,3-dimethyl-5-oxotetrahydrofuran-2-ylmethyl ester, (meth)acrylic acid-4,4-dimethyl-5-oxotetrahydrofuran-2-ylmethyl ester, and the like.

Examples of the repeating unit having a cyclic carbonate structure include repeating units represented by the following formula:

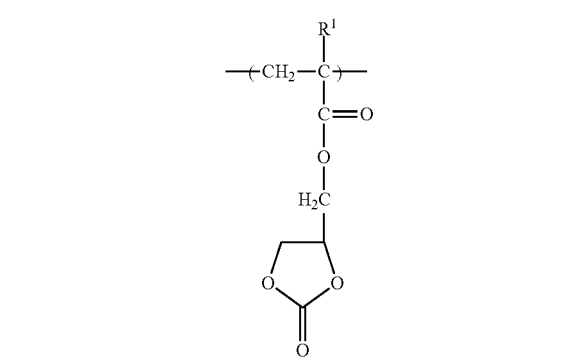

(wherein, $R^1$ is as defined in the above formula (1).)

The other repeating units include those derived from other (meth)acrylic esters such as hydroxyl group-containing (meth)acrylic ester, carboxyl group-containing (meth)acrylic ester, and the like.

The proportion of the repeating unit (3) in the polymer (B1) is preferably 0.1 to 20% by mole, and particularly preferably 0.1 to 10% by mole with respect to all repeating units in the acid-dissociable polymer included in the radiation-sensitive resin composition. When this proportion is less than 0.1% by mole, the effect of adjusting the pattern configuration, reduction of LWR and the like may be insufficient. In contrast, when the proportion exceeds 20% by mole, problems of defective shape due to insufficient exposure latitude (insufficient EL margin) or transmission impairment are likely to occur.

Also, when the polymer (B1) has the repeating unit (2), the proportion of the repeating unit (2) in the acid-dissociable polymer included in the radiation-sensitive resin composition with respect to all repeating units is preferably 20 to 80% by mole, and particularly preferably 25 to 75% by mole. The proportion being less than 20% by mole leads to failure in obtaining sufficient solubility, whereby the resolving ability can be deteriorated. In contrast, when the proportion exceeds 80% by mole, the adhesiveness with the substrate may be impaired. It is preferred to adjust each copolymerizing proportion and mixing ratio of the polymer (A) and the polymer (B1) so as to adjust the proportion to fall within the above range.

<Acid Generator (B2)>

Examples of the acid generator (B2) include onium salts such as sulfonium salts and iodonium salts, organic halogen compounds, sulfone compounds such as disulfones and diazomethanesulfones, and dicarboxylmide compounds.

Specific examples of preferable acid generator (B2) include: triphenylsulfonium salt compounds such as triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate and triphenylsulfonium camphorsulfonate;

4-cyclohexylphenyldiphenylsulfonium salt compounds such as 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate and 4-cyclohexylphenyldiphenylsulfonium camphorsulfonate;

4-methanesulfonylphenyldiphenylsulfonium salt compounds such as 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate and 4-methanesulfonylphenyldiphenylsulfonium camphorsulfonate; diphenyliodonium salt compounds such as diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate and diphenyliodonium camphorsulfonate;

bis(4-t-butylphenyl)iodonium salt compounds such as bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate and bis(4-t-butylphenyl)iodonium camphorsulfonate;

1-(4-n-butoxynaphthalen-1-yl)tetrahydrothiophenium salt compounds such as 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate and 1-(4-n-butoxynaphthalen-1-yl)tetrahydrothiophenium camphorsulfonate;

1-(4-n-butoxynaphthalen-1-yl)tetrahydrothiophenium salt compounds such as 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate and 1-(6-n-butoxynaphthalen-2-yl)tetrahydrothiophenium camphorsulfonate;

1-(3,5-dimethyl-4-hydroxyphenyl)tetrahydrothiophenium salt compounds such as 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate and 1-(3,5-dimethyl-4-hydroxyphenyl)tetrahydrothiophenium camphorsulfonate;

bicyclo[2.2.1]hept-5-ene-2,3-dicarboxylmide compounds such as N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3-dicarboxylmide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxylmide and N-(camphorsulfonyloxy)bicyclo[2.2.1]hept-5-ene-2,3-dicarboxylmide, and the like.

The acid generator (B2) may be used alone, or two or more thereof may be used as a mixture. In light of securement of the sensitivity and developability as a resist, the amount of the acid generator (B2) blended is preferably 0.1 to 30 parts by mass, and more preferably 0.1 to 20 parts by mass relative to 100 parts by mass of the polymer (A). In this case, the amount of the blended acid generator being less than 0.1 parts by mass is likely to result in lowering of the sensitivity and developability, whereas the amount exceeding 30 parts by mass results in reduction for transparency for radioactive rays, whereby a rectangular resist pattern is less likely to be obtainable. Also, the acid generator (B2) is not an essential component of the radiation-sensitive resin composition, it may be used as an optional component.

<Method for Producing Polymer (A) and Polymer (B1)>

Although the method for producing the polymer (A) and the polymer (B1) used in each polymer of the embodiment of the present invention and the radiation-sensitive resin composition of the embodiment of the present invention are not particularly limited, for example, they may be produced by polymerizing a polymerizable unsaturated monomer corresponding to each repeating unit that constitutes a desired molecular composition in the presence of a radical polymerization initiator, a chain transfer agent and the like in an appropriate solvent. The radical polymerization initiator is preferably added to give a sufficiently high concentration in order to attain a sufficient polymerization velocity. However, when the proportion of the amount of the radical polymerization initiator with respect to the amount of the chain transfer agent is too high, a radical-radical coupling reaction occurs to generate an undesirable non-living radical polymer; therefore, the resulting polymer will include a portion where polymeric properties such as molecular weight and molecular weight distribution are not controlled. The molar ratio of the amount of the radical polymerization initiator with respect to the amount of the chain transfer agent is preferably from 1:1 to 0.005:1.

The radical polymerization initiator is not particularly limited, and may be exemplified by a thermal polymerization initiator, a redox polymerization initiator, and a photopolymerization initiator. Specific examples include polymerization initiators such as peroxide and azo compounds. More specifically, examples of the radical polymerization initiator include t-butylhydroperoxide, t-butylperbenzoate, benzoylperoxide, 2,2'-azobis(2,4-dimethylvaleronitrile), 2,2'-azobisisobutyronitrile (AIBN), 1,1'-azobis(cyclohexanecarbonitrile), dimethyl-2,2'-azobisisobutyrate (MAIB), dimethyl azobisisobutyronitrile, and the like.

Examples of the chain transfer agent include pyrazole derivatives, alkylthiols, and the like.

The polymerization operation may involve any process for polymerization such as common batchwise polymerization, and dripping polymerization. For example, the monomers of a necessary type and in a required amount for forming each of the aforementioned repeating units (1) and (2), and other repeating units are dissolved in an organic solvent to polymerize in the presence of the radical polymerization initiator and the chain transfer agent to obtain the polymer (A1). As the polymerization solvent, in general, an organic solvent that can dissolve the monomer, the radical polymerization initiator and the chain transfer agent may be used. Examples of the organic solvent include ketone solvents, ether solvents, aprotic polar solvents, ester solvents, aromatic solvents, and linear or cyclic aliphatic solvents. Examples of the ketone solvent include methyl ethyl ketone, acetone, and the like. Examples of the ether solvent include alkoxyalkyl ethers, such as e.g., methoxymethyl ether, ethyl ether, tetrahydrofuran, 1,4-dioxane, and the like. Examples of the aprotic polar solvent include dimethylformamide, dimethylsulfooxide, and the like. Examples of the ester solvent include alkyl acetates, such as e.g., ethyl acetate, methyl acetate, and the like. Examples of the aromatic solvent include alkylaryl solvents such as e.g., toluene and xylene, and halogenated aromatic solvents such as e.g., chlorobenzene, and the like. Examples of the aliphatic solvent include hexane, cyclohexane, and the like.

The polymerization temperature is generally 20 to 120° C., preferably 50 to 110° C., and more preferably 60 to 100° C. Although the polymerization can be executed in a normal ambient air atmosphere in some cases, the polymerization is preferably carried out in an inert gas atmosphere such as nitrogen or argon. The molecular weight of the polymer (A) can be adjusted by controlling the proportion of the amount of the monomer and the amount of the chain transfer agent. The polymerization time is generally 0.5 to 144 hrs, preferably 1 to 72 hrs, and more preferably 2 to 24 hrs.

The polymer (A) and the polymer (B1) may or may not have a residue derived from the chain transfer agent at the molecular chain end, or may have a partially remaining residue derived from the chain transfer agent at the molecular chain end.

It is preferred that the polymer used in the radiation-sensitive resin composition of the embodiment of the present invention includes impurities such as halogen and metal in amounts as low as possible of course, and that the amounts of the residual monomers and the oligomer components are not greater than given values, for example, 0.1% by mass or less as determined by an analysis on HPLC. Accordingly, a radiation-sensitive resin composition can be obtained that is not only capable of further improving sensitivity, resolution, process stability, pattern configuration and the like as a resist, but also enabling use as a resist accompanied by less foreign matter in the liquid, and less time-dependent alteration of the sensitivity, etc.

Exemplary methods for purifying the polymer include the following methods, for example. (1) Methods for removing impurities such as metal may include a method in which a zeta potential filter is used to allow the metal in the polymer solution to be adsorbed, a method in which a polymer solution is cleaned with an acidic aqueous solution such as oxalic acid or sulfonic acid to remove the metal in the state being chelated, and the like. In addition, (2) methods for removing residual monomers and oligomer components to decrease the amounts not greater than given values may include purification methods in the state of solution such as: a liquid-liquid extraction method of removing residual monomers and oligomer components by washing with water or appropriate solvent(s) which may be appropriately combined; ultrafiltration for extracting and removing only substances having a certain molecular weight or less; and the like, as well as purification methods in the state of solid such as: a reprecipitation method for removing residual monomers, etc., by adding the polymer solution to a poor solvent dropwise to allow the polymer to coagulate in the poor solvent; filtering off and washing a resultant polymer slurry with a poor solvent; and the like.

Also, these methods may be employed in combination. Although it is impossible to categorically exemplify the poor solvent which may be used in the aforementioned reprecipitation method since it depends on physical properties and the like of the polymer to be purified, persons skilled in the art would be able to select ad libitum to meet the physical properties and the like of the polymer.

The weight average molecular weight in terms of polystyrene (hereinafter, abbreviated as "Mw") of the polymer of the embodiment of the present invention and the polymer used in the radiation-sensitive resin composition of the embodiment of the present invention on gel permeation chromatography (GPC) is usually 1,000 to 300,000, preferably 2,000 to 300,000, and more preferably 2,000 to 12,000. When the Mw of the polymer is less than 1,000, heat resistance as a resist is likely to be deteriorated. On the other hand, when the Mw exceeds 300,000, developability as a resist is likely to be deteriorated.

In addition, the ratio (Mw/Mn) of the polymer, Mw to the number average molecular weight in terms of polystyrene on gel permeation chromatography (GPC) (hereinafter, abbreviated as "Mn"), is preferably 1 to 5, more preferably 1 to 3, and particularly preferably 1 to 1.6.

<Other Components>

Various types of additives such as an acid diffusion controlling agent, an alicyclic additive, a surfactants and a sensitizer may be included as needed in the radiation-sensitive resin composition of the embodiment of the present invention.

The acid diffusion controlling agent may or may not be included since the polymer (A) used in the embodiment of the present invention has acid diffusion controllability per se, favorable resolution, pattern configuration, LWR characteristics can be obtained even if any other acid diffusion controlling agent is not used in combination. As the other acid diffusion controlling agent, a nitrogen-containing organic compound other than the polymer (A) is preferably used.

Examples of the nitrogen-containing organic compound include: compounds represented by the following formula (4): (hereinafter, may be also referred to as "nitrogen-containing compound (I)"); compounds having two nitrogen atoms in a single molecule (hereinafter, may be also referred to as "nitrogen-containing compound (II)"); polyamino compounds having three or more nitrogen atoms in a single molecule, and polymers thereof (hereinafter, may be correctively referred to as "nitrogen-containing compound (III)"); amide group-containing compounds; urea compounds; nitrogen-containing heterocyclic compounds; and the like.

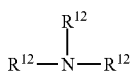

(4)

In the formula (4), $R^{12}$ groups each independently represent a hydrogen atom, a linear, branched or cyclic alkyl group which may be substituted, an aryl group, or an aralkyl group.

Examples of the nitrogen-containing compound (I) include: mono(cyclo)alkylamines such as n-hexylamine, n-heptylamine, n-octylamine, n-nonylamine, n-decylamine and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyl dimethylamine, methyldicyclohexylamine and tricyclohexylamine; substituted alkylamine such as 2,2',2''-nitrotriethanol; aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine and 2,6-diisopropylaniline.

Examples of the nitrogen-containing compound (II) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylenediamine, N,N,N',N'',N''pentamethyldiethylenetriamine, and the like.

Examples of the nitrogen-containing compound (III) include polyethyleneimine, polyallylamine, polymers of 2-dimethylaminoethylacrylamide, and the like.

Examples of the amide group-containing compound include: N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonyl hexamethylenediamine, N,N,N'N'-tetra-t-butoxycarbonyl hexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole and N-t-butoxycarbonylpyrrolidine; as well as formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compound include urea, methylurea, 1,1-dimethyl urea, 1,3-dimethylurea, 1,1,3,3-tetramethylurea, 1,3-diphenylurea, tri-n-butylthiourea, and the like.

Examples of the nitrogen-containing heterocyclic compound include imidazoles such as imidazole, 4-methylimidazole, 4-methyl-2-phenylimidazole, benzimidazole, 2-phenylbenzimidazole, 1-benzyl-2-methylimidazole and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 4-hydroxyquinoline, 8-oxyquinoline, acridine and 2,2':6',2''-terpyridine; piperazines such as piperazine and 1-(2-hydroxyethyl)piperazine; as well as pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

The amount of the nitrogen-containing organic compound blended is preferably 15 parts by mass or less, more preferably 10 parts by mass or less, and particularly preferably 5 parts by mass or less relative to 100 parts by mass of the polymer. When the amount exceeds 15 parts by mass, sensitivity as a resist and developability of the exposed region may be deteriorated. In contrast, when the amount of the nitrogen-containing organic compound blended is less than 0.001 parts by mass, pattern configuration and dimensional fidelity as a resist may be deteriorated in accordance with the process conditions.

The alicyclic additive may have an acid-dissociable group, and is a compound which exhibits actions of further improving dry etching resistance, pattern configuration, adhesiveness with the substrate, and the like.

Examples of the alicyclic additive include: adamantane derivatives such as t-butyl 1-adamantanecarboxylate, t-butoxycarbonylmethyl 1-adamantanecarboxylate, 1-adamantanecarboxylic acid α-butyrolactone ester, di-t-butyl 1,3-adamantanedicarboxylate, t-butyl 1-adamantaneacetate, t-butoxycarbonylmethyl 1-adamantaneacetate, di-t-butyl 1,3-adamantanediacetate and 2,5-dimethyl-2,5-di(adamantylcarbonyloxy)hexane;

deoxycholic acid esters such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate and deoxycholic acid mevalonolactone ester; lithocholic acid esters such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate and lithocholic acid mevalonolactone ester, and the like. The alicyclic additives described above may be used alone, or two or more thereof may be used in combination.

The surfactant is a component that serves in improving coating properties, striation, developability and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate, as well as KP341 (manufactured by Shin-Etsu Chemical Co., Ltd.), Polyflow No. 75 and Polyflow No. 95 (manufactured by Kyoeisha Chemical Co., Ltd.), EFROP EF301, EFROP EF303 and EFROP EF352 (manufactured by Tochem Products Corporation), Megaface® F171 and Megaface® F173 (manufactured by Dainippon Ink And Chemicals, Incorporated), Fluorad™ FC430 and Fluorad FC431 (manufactured by Sumitomo 3M Limited), ASAHI GUARD AG710, Surflon S-382, Surflon SC-101, Surflon SC-102, Surflon SC-103, Surflon SC-104, Surflon SC-105 and Surflon SC-106 (manufactured by Asahi Glass Co., Ltd.), the foregoing, all trade names, and the like. The surfactants described above may be used alone, or two or more thereof may be used in combination. The amount of the surfactant blended is preferably 2 parts by mass or less relative to 100 parts by mass of the polymer (A).

The sensitizer has an effect of improving apparent sensitivity of the resin composition by serving in absorbing the energy of radioactive rays, and the energy is transferred to a photo acid generator in the form of, for example, radical or electron, thereby increasing the amount of acid generation. Examples of the sensitizer include carbazoles, benzophenones, rose bengals, anthracenes, phenols and the like. The sensitizers described above may be used alone, or two or more thereof may be used in combination. The amount of the sensitizer blended is preferably 50 parts by mass or less relative to 100 parts by mass of the polymer (A).

<Preparation of Radiation-Sensitive Resin Composition>

The radiation-sensitive resin composition of the embodiment of the present invention is prepared upon use as a solution of the radiation-sensitive resin composition by dissolving in a solvent so as to give the total solid content of usually 1 to 50% by mass, and preferably 3 to 25% by mass, followed by filtration with a filter having a pore size of, for example, about 0.2 μm. Examples of the solvent used for preparing the solution of the radiation-sensitive resin composition include linear or branched ketones such as 2-pentanone, 2-hexanone, 2-heptanone and 2-octanone; cyclic ketones such as cyclopentanone and cyclohexanone; propylene glycol monoalkyl ether acetates such as propylene glycol monomethyl ether acetate and propylene glycol monoethyl ether acetate; alkyl 2-hydroxypropionates such as methyl 2-hydroxypropionate, and ethyl 2-hydroxypropionate; alkyl 3-alkoxypropionates such as methyl 3-methoxypropionate, ethyl 3-methoxypropionate, methyl 3-ethoxypropionate and ethyl 3-ethoxypropionate, as well as ethylene glycol monomethyl ether, ethylene glycol monoethyl ether, diethylene glycol dimethyl ether, diethylene glycol diethyl ether, ethylene glycol monomethyl ether acetate, ethylene glycol monoethyl ether acetate, propylene glycol monomethyl ether, propylene glycol monoethyl ether, n-butyl acetate, methyl pyruvate, ethyl pyruvate, N-methylpyrrolidone, γ-butyrolactone, and the like.

These solvents may be used alone or two or more thereof may be used as a mixture, but it is preferred to contain at least one selected from propylene glycol monomethyl ether acetate, propylene glycol monomethyl ether, 2-heptanone, cyclohexanone, γ-butyrolactone, ethyl 2-hydroxypropionate and ethyl 3-ethoxypropionate.

<Method for Forming Photoresist Pattern>

The radiation-sensitive resin composition of the embodiment of the present invention is useful as a chemically amplified resist. In a positive type chemically amplified resist, due to an action of the acid generated from an acid generator upon exposure, a resin component, predominantly an acid-dissociable group in the polymer (A), is dissociated to generate a polar group typified by a carboxyl group. As a result, solubility of the resist at light-exposed sites in an alkaline developer increases, whereby the light-exposed sites are dissolves in the alkaline developer and removed. Accordingly, a positive type photoresist pattern is obtained.

In the case of negative type, by including a crosslinking agent or the like, a crosslinking reaction between an alkali-soluble resin component and the crosslinking agent readily occurs due to an action of the acid generated from an acid generator upon exposure. As a resist, solubility of the light-exposed sites in an alkaline developer decreases, whereby the light-unexposed sites are dissolved in the alkaline developer and removed. Accordingly, a resist pattern is obtained.

Hereinafter, a method for forming a photoresist pattern using a positive type radiation-sensitive resin composition is explained in detail.

The method for forming a photoresist pattern generally preformed, for example, according to the following steps: (1) using a radiation-sensitive resin composition to form a photoresist film on a substrate (hereinafter, may be referred to as "step (1)"); (2) exposing the formed photoresist film by irradiating (via a liquid immersion medium, as needed) with a radioactive ray through a mask having a predetermined pattern (hereinafter, may be referred to as "step (2)"); heating the substrate (exposed photoresist film) (hereinafter, may be referred to as "step (3)"); and then (4) enabling a photoresist pattern to be formed when developed (hereinafter, may be referred to as "step (4)").

In the step (1), a radiation-sensitive resin composition, or a composition solution obtained by dissolving the same in a solvent is applied on a substrate (e.g., silicon wafer, wafer coated with silicon dioxide or an antireflection film, or the like) by an appropriate means for application such as spin-coating, cast coating, roll coating to form a photoresist film. Specifically, after the resin composition solution is applied such that a resulting resist film has a predetermined film thickness, the solvent in the coating film is vaporized by prebaking (PB) to form a resist film.

In the step (2), the photoresist film formed in the step (1) (if necessary, via a liquid immersion medium such as water), is exposed by irradiating with a radioactive ray. In this step, the radioactive ray is irradiated through a mask having a predetermined pattern. The radioactive ray appropriately selected from visible light rays, ultraviolet rays, deep ultraviolet rays, X-ray, charged particle ray and the like in accordance with the line width of the intended pattern may be irradiated. Of these, deep ultraviolet rays typified by ArF excimer laser light (wavelength: 193 nm) and KrF excimer laser light (wavelength: 248 nm) are preferred, and ArF excimer laser light is particularly preferred.

The step (3) is referred to as "post exposure bake (PEB)", in which the acid generated from acid generator deprotects the polymer at sites of the photoresist film exposed in the step (2). There arises the difference between the solubility of portions which were exposed (light-exposed site) and that of portions which were not exposed (light-unexposed site) in an alkaline developer. PEB is performed at an appropriately selected temperature from the range of usually form 50° C. to 180° C.

In the step (4), the exposed photoresist film is developed with a developing solution to form a predetermined photoresist pattern. After the development, the film is, in general, washed with water, and then dried. The developing solution is preferably an alkali aqueous solution prepared by dissolving at least one alkaline compound such as, for example, sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene.

Alternatively, when liquid immersion lithography is carried out, a protective film for liquid immersion that is insoluble in the immersion liquid may be provided on the resist film prior to the step (2) so as to protect the resist film from being brought into direct contact with the immersion liquid. Any one of a protective film removable with solvent that is to be removed by a solvent prior to the step (4) (for example, see JP-A No. 2006-227632), and a protective film removable with developing solution that is to be removed during the development in the step (4) (for example, see PCT International Publication Nos. WO 2005-069076 and WO 2006-035790) may be used as the protective film for liquid immersion. It is preferable to use a protective film for liquid immersion removable with developing solution in light of throughput.

Since thus obtained resist pattern has favorable rectangularity, and has reduced LWR, it is suitable for fine processing in which a lithography technique is applied.

EXAMPLES

Hereinafter, embodiments of the present invention are more specifically described by way of Examples. However, these Examples should not be construed as in any way limiting the present invention. Herein, the "part" is on mass basis unless otherwise stated particularly.

Each measurement and evaluation in the following Synthesis Examples was performed as described below.

(1) Mw and Mn

Mw and Mn were measured by gel permeation chromatography (GPC) using GPC columns manufactured by Tosoh Corporation (G2000HXL×2, G3000HXL×1, G4000HXL×1) under analysis conditions including a flow rate of 1.0 mL/min, an elution solvent of tetrahydrofuran, a column temperature of 40° C., with mono-disperse polystyrene as a standard. Also, dispersity index Mw/Mn was calculated from the measurement results.

(2) $^{13}$C-NMR, $^{1}$H-NMR Analyses $^{13}$C-NMR analysis of each resin and $^{1}$H-NMR of monomer were determined using "JNM-EX270" manufactured by JEOL Ltd.

<Synthesis of Compound (i)>

Synthesis Example of an onium salt compound (i.e., compound (i)) having a polymerizable unsaturated bond and having a sulfonamide as an anion is explained below.

An ion exchange resin (QAE Sephadex A-25) in an amount of 20 g manufactured by GE Health Care Bioscience Ltd. was swollen in ultra pure water overnight, and packed in a column tube. Thereto was applied a solution prepared by dissolving in methanol, 28 g of a sodium salt represented by the following formula (X-1) obtained by deprotonating a (X-1) derivative manufactured by Central Glass Co., Ltd. with a metal base such as sodium bicarbonate, whereby a sulfonamide anion was supported on the resin. After a sufficient amount of methanol was used to permit flash back, a solution prepared by dissolving 5.2 g of triphenylsulfonium chloride in methanol was loaded on the column tube to allow for anion exchange. After the solvent of thus obtained solution was removed with an evaporator, drying at room temperature overnight gave 8.1 g of the following compound (M-5).

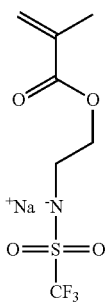

(X-1)

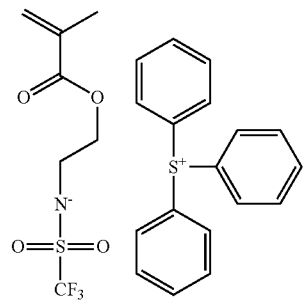

(M-5)

The synthesized compound (M-5) was identified by $^{1}$H-NMR. The peak intensity and chemical shift are shown below.

$^{1}$H-NMR: 1.94 (s, 3H, CCH$_3$), 3.59 (t, 2H, J=5.2, Hz, OCH$_2$CH$_2$), 4.31 (t, 2H, J=5.2, OCH$_2$CH$_2$), 5.61 (s, 1H, CCH$_2$), 6.16 (s, 1H, CCH$_2$), 7.67-7.80 (m, 15H, ArH)

Hereinafter, each of Synthesis Examples of polymer (A1), (A11) and (B1) is demonstrated. As the polymer (A1), (A11) and (B1), monomers each used in synthesizing the polymer (A-1) to polymer (A-9) are shown below which are represented by the formulae (M-1) to (M-7).

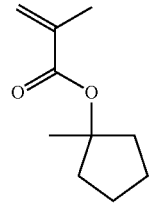

(M-1)

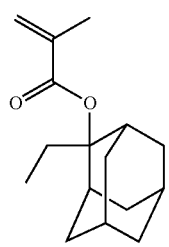

(M-2)

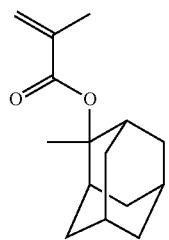

(M-3)

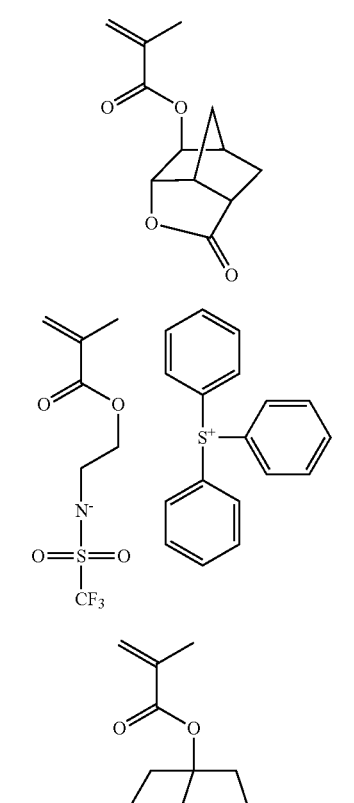

Synthesis of Polymer (A-1)

Synthesis Example 1

Monomer solutions were prepared by each dissolving 8.0 g (35% by mole) of the monomer (M-1), 5.0 g (15% by mole) of the monomer (M-2), 13.5 g (45% by mole) of the monomer (M-4) and 3.5 g (5% by mole) of the monomer (M-5) in 60 g of 2-butanone, and further charging 1.1 g (5% by mole) of dimethyl azobisisobutyronitrile thereto. On the other hand, a 200 ml three-necked flask charged with 30 g of 2-butanone was purged with nitrogen for 30 min, and after the nitrogen purge, the reaction vessel was heated to 80° C. while stirring. The aforementioned monomer solution prepared beforehand was added dropwise using a dropping funnel over 3 hrs. The polymerization reaction was allowed for 6 hrs from the initiation of addition of the monomer solution as the polymerization start time. After completion of the polymerization, the polymer solution was cooled with water to 30° C. or less. The polymer solution was added to 600 g of methanol, and a white powder precipitated was collected by filtration. The white powder thus collected by filtration was washed in a slurry state twice with 150 g of methanol, followed by correcting by filtration and drying at 50° C. for 17 hrs to obtain a white powdery copolymer (hereinafter, may be also referred to as "polymer (A-1)"). The Mw, Mw/Mn (molecular weight dispersity index) and the yield (% by mass) of the obtained polymer, and the proportion (% by mole) of each repeating unit in the polymer were determined. The results are shown in Table 2. Moreover, the proportion of low molecular weight component having a molecular weight of less than 1,000 contained in the obtained polymer was less than 0.1% by mass as a result of measurement on GPC.

Synthesis Examples 2 to 9

Polymers (A-2) to (A-9) were obtained in a similar manner to Synthesis Example 1 except that the monomers shown in Table 1 below were each used in proportions presented in Table 1. The Mw, Mw/Mn (molecular weight dispersity index) and the yield (% by mass) of the obtained polymer, and the proportion (% by mole) of each repeating unit in the polymer were determined. The results are shown in Table 2.

TABLE 1

|  | Polymer (A) | Monomer 1 (mol %) | Monomer 2 (mol %) | Monomer 3 (mol %) | Monomer 4 (mol %) | Amount of initiator (mol %) |
|---|---|---|---|---|---|---|
| Synthesis Example 1 | A-1 | M-1 (35) | M-2 (15) | M-4 (45) | M-5 (5) | 5 |
| Synthesis Example 2 | A-2 | M-3 (55) | M-4 (42) | M-5 (3) | — | 5 |
| Synthesis Example 3 | A-3 | M-1 (35) | M-2 (15) | M-4 (50) | — | 5 |
| Synthesis Example 4 | A-4 | M-3 (55) | M-4 (45) | — | — | 5 |
| Synthesis Example 5 | A-5 | M-4 (48) | M-5 (3) | M-6 (46) | M-7 (3) | 5 |
| Synthesis Example 6 | A-6 | M-4 (48) | M-5 (6) | M-6 (46) | — | 5 |
| Synthesis Example 7 | A-7 | M-4 (48) | M-6 (46) | M-7 (6) | — | 5 |

TABLE 1-continued

|  | Polymer (A) | Monomer 1 (mol %) | Monomer 2 (mol %) | Monomer 3 (mol %) | Monomer 4 (mol %) | Amount of initiator (mol %) |
|---|---|---|---|---|---|---|
| Synthesis Example 8 | A-8 | M-4 (46) | M-5 (4) | M-6 (46) | M-7 (4) | 5 |
| Synthesis Example 9 | A-9 | M-4 (50) | M-5 (2) | M-6 (46) | M-7 (2) | 5 |

*In the parentheses next to Monomers 1 to 4, the proportion (mol %) added is shown.

TABLE 2

|  | Polymer (A) | Yield (%) | Monomer 1 | Monomer 2 | Monomer 3 | Monomer 4 | Mw | Mw/Mn |
|---|---|---|---|---|---|---|---|---|
| Synthesis Example 1 | A-1 | 60.5 | 35.2 | 14.8 | 45.7 | 4.3 | 6800 | 1.35 |
| Synthesis Example 2 | A-2 | 64.5 | 52.0 | 45.3 | 2.7 | — | 6800 | 1.38 |
| Synthesis Example 3 | A-3 | 64.2 | 34.3 | 13.9 | 51.8 | — | 6900 | 1.39 |
| Synthesis Example 4 | A-4 | 65.5 | 52.4 | 47.6 | — | — | 6700 | 1.60 |
| Synthesis Example 5 | A-5 | 78.3 | 47.8 | 3.0 | 46.2 | 3.0 | 6500 | 1.81 |
| Synthesis Example 6 | A-6 | 82.1 | 48.2 | 6.1 | 45.7 | — | 6300 | 2.02 |
| Synthesis Example 7 | A-7 | 79.4 | 48.3 | 45.8 | 5.9 | — | 6100 | 2.03 |
| Synthesis Example 8 | A-8 | 78.5 | 46.2 | 4.0 | 45.8 | 4.0 | 6200 | 1.83 |
| Synthesis Example 9 | A-9 | 79.2 | 49.7 | 2.0 | 46.3 | 2.0 | 6000 | 1.82 |

<Preparation of Radiation-Sensitive Resin Composition>

At the proportions shown in the parentheses of each component listed in Table 3, the polymer (A), the acid generator (B), the nitrogen-containing compound (D) and the solvent (C) were mixed to prepare radiation-sensitive resin compositions of Examples 1 to 8 and Comparative Examples 1 to 3.

TABLE 3

|  | Polymer (A) (part) | Acid generator (B) (part) | Nitrogen-containing compound (D) (part) | Solvent (C) (part) |
|---|---|---|---|---|
| Example 1 | A-1 (100) | B-3 (8.5) | — | C-1 (1700) C-2 (700) C-3 (30) |
| Example 2 | A-1 (100) | B-1 (4.5) B-2 (4.0) | — | C-1 (1700) C-2 (700) C-3 (30) |
| Example 3 | A-2 (100) | B-3 (8.5) | — | C-1 (1700) C-2 (700) C-3 (30) |
| Example 4 | A-1 (50) A-3 (50) | B-3 (8.5) | — | C-1 (1700) C-2 (700) C-3 (30) |
| Example 5 | A-2 (50) A-4 (50) | B-3 (8.5) | D-1 (0.6) | C-1 (1700) C-2 (700) C-3 (30) |
| Example 6 | A-5 (100) | — | — | C-1 (1700) C-2 (700) C-3 (30) |
| Example 7 | A-6 (50) A-7 (50) | — | — | C-1 (1700) C-2 (700) C-3 (30) |
| Example 8 | A-8 (50) A-9 (50) | — | — | C-1 (1700) C-2 (700) C-3 (30) |
| Comparative Example 1 | A-3 (100) | B-3 (8.5) | D-1 (1.10) | C-1 (1700) C-2 (700) C-3 (30) |
| Comparative Example 2 | A-4 (100) | B-3 (8.5) | D-1 (1.3) | C-1 (1700) C-2 (700) C-3 (30) |
| Comparative Example 3 | A-3 (100) | B-3 (8.5) | — | C-1 (1700) C-2 (700) C-3 (30) |

Details of the acid generator (B), the nitrogen-containing compound (D) and the solvent (C) listed in Table 3 are shown below. Also, in the Table, "part" is on mass basis unless otherwise stated particularly.

<Acid Generator (B)>
(B-1): triphenylsulfonium nonafluoro-n-butanesulfonate
(B-2): triphenylsulfonium 2-(bicyclo[2.2.1]hepta-2'-yl)-1,1-difluoroethanesulfonate
(B-3): triphenylsulfonium 2-(bicyclo[2.2.1]hepta-2'-yl)-1,1,2,2-tetrafluoroethanesulfonate, <Nitrogen-Containing Compound (D)>
(D-1): N-t-butoxycarbonyl-4-hydroxypiperidine <Solvent (C)>
(C-1): propylene glycol monomethyl ether acetate
(C-2): cyclohexanone
(C-3): γ-butyrolactone <Evaluation of Radiation-Sensitive Resin Composition>

Various types of evaluations were made as in the following on each of the radiation-sensitive resin compositions of Examples 1 to 8 and Comparative Examples 1 to 3. The results of these evaluations are shown in Table 4.

<Sensitivity>

Using as a substrate a silicon wafer on which an ARC29 (manufactured by Nissan Chemical Industries, Ltd.) film having a film thickness of 770 Å had been formed on the wafer surface, each composition solution was applied on the substrate by spin coating with CLEANTRACK ACT8 (manufactured by Tokyo Electron Ltd.). A resist coating film having a film thickness of 0.09 µm was thus formed by performing PB on a hot plate under conditions shown in Table 4. The resist coating film formed as described above was exposed through a mask pattern using an ArF excimer laser exposure system "S306C" (numerical aperture: 0.78) manufactured by Nikon Corporation. After performing PEB under conditions shown in Table 4, the composition was developed at 23° C. for 60 sec with a 2.38% by mass tetramethylammonium hydroxide aqueous solution. A positive type resist pattern was formed by washing with water, and drying. In this procedure, the exposure dose was defined to be optimal provided that a line-and-space pattern (1L/1S) with a diameter of 0.090 µm in the mask can yield a size of a diameter being 0.090 µm. Such an optimum dose was defined as sensitivity.

<Cross-Sectional Shape of Pattern (Pattern Configuration)>

A cross-sectional shape of a 0.075 µm line-and-space pattern in the determination of the sensitivity as described above was observed on "S-4800" manufactured by Hitachi High-Technologies Corporation. The evaluation was made as: "unfavorable" when a T-top shape (i.e., shape other than rectangular) was exhibited; or "favorable" when a rectangular shape was exhibited.

<LWR (Line Width Roughness)>

A 0.090 µm (1L/1S) pattern formed on the resist coating film on the substrate at the aforementioned optimum dose was observed from above the pattern using Measurement SEM (manufactured by Hitachi, Ltd., model "S9380"). The diameter was measured at arbitrary points, and the fluctuation as determined was indicated by 3σ.

Note that the smaller the value, the better the LWR. LWR was evaluated as "favorable" when the value was 9.0 nm or less.

The radiation-sensitive resin compositions according to Examples 1 to 8 had sufficient sensitivity, and were capable of forming a pattern having favorable shape and low LWR. On the other hand, the compositions of Comparative Examples 1 and 2 exhibited unfavorable LWR, whereas the composition of Comparative Example 3 resulted in unfavorable pattern configuration.

<Synthesis of Compound (ii)>

Synthesis Example of an onium salt compound (i.e., compound (ii)) having a polymerizable unsaturated bond and having a carboxylate anion is explained below.

<Synthesis of Compound (M-21)>

An ion exchange resin (QAE Sephadex A-25) in an amount of 20 g manufactured by GE Health Care Bioscience Ltd. was swollen in ultra pure water overnight, and packed in a column tube. Thereto was applied a solution prepared by dissolving in methanol, 31 g of a sodium salt obtained by deprotonating a compound represented by the following formula (X-21) manufactured by Mitsubishi Rayon Co., Ltd. with a metal base such as sodium bicarbonate, whereby a carboxylate anion was supported on the resin. After a sufficient amount of methanol was used to permit flash back, a solution prepared by dissolving 5.2 g of triphenylsulfonium chloride in methanol was loaded on the column tube to allow for anion exchange. After the solvent of thus obtained solution was removed with an evaporator, drying at room temperature overnight gave 8.4 g of the following compound (M-21).

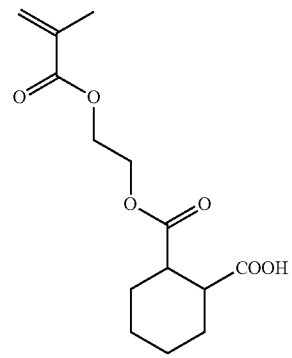

(X-21)

TABLE 4

| | PB (temperature/time) | PEB (temperature/time) | Sensitivity (mJ/cm$^2$) | Pattern Configuration | LWR |
|---|---|---|---|---|---|
| Example 1 | 110/60 | 95/60 | 59 | favorable | favorable (8.2 nm) |
| Example 2 | 110/60 | 95/60 | 55 | favorable | favorable (8.7 nm) |
| Example 3 | 110/60 | 115/60 | 46 | favorable | favorable (8.9 nm) |
| Example 4 | 110/60 | 95/60 | 47 | favorable | favorable (8.7 nm) |
| Example 5 | 110/60 | 115/60 | 46 | favorable | favorable (9 nm) |
| Example 6 | 110/60 | 140/60 | 58 | favorable | favorable (7.3 nm) |
| Example 7 | 110/60 | 140/60 | 58 | favorable | favorable (7.2 nm) |
| Example 8 | 110/60 | 140/60 | 58 | favorable | favorable (7.1 nm) |
| Comparative Example 1 | 110/60 | 95/60 | 45 | favorable | unfavorable (10.2 nm) |
| Comparative Example 2 | 110/60 | 115/60 | 48 | favorable | unfavorable (11.0 nm) |
| Comparative Example 3 | 110/60 | 95/60 | <20 | unfavorable | unfavorable (13.0 nm) |

(M-21)

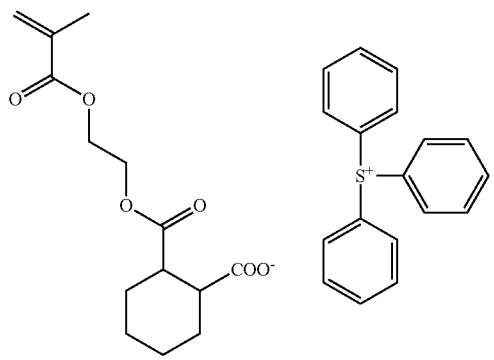

The synthesized compound (M-21) was identified by ¹H-NMR. The peak intensity and chemical shift are shown below.

¹H-NMR: 1.92 (s, 3H, CCH₃), 1.04-1.92 (m, 8H, CH₂), 2.23-2.25 (m, 2H, COCH), 4.01-4.02 (m, 1H, OCH₂), 422-4.23 (m, 3H, OCH₂), 5.55 (s, 1H, CCH₂), 6.10 (s, 1H, CCH₂), 7.65-7.89 (m, 15H, ArH)

<Synthesis of Compound (M-22)>

An ion exchange resin (QAE Sephadex A-25) in an amount of 20 g manufactured by GE Health Care Bioscience Ltd. was swollen in ultra pure water overnight, and packed in a column tube. Thereto was applied a solution prepared by dissolving in methanol, 12 g of a sodium salt obtained by deprotonating a compound represented by the following formula (X-22) manufactured by Aldrich Co., with a metal base such as sodium bicarbonate, whereby a carboxylate anion was supported on the resin. After a sufficient amount of methanol was used to permit flash back, a solution prepared by dissolving 5.2 g of triphenylsulfonium chloride in methanol was loaded on the column tube to allow for anion exchange. After the solvent of thus obtained solution was removed with an evaporator, drying at room temperature overnight gave 5.6 g of the following compound (M-22).

(X-22)

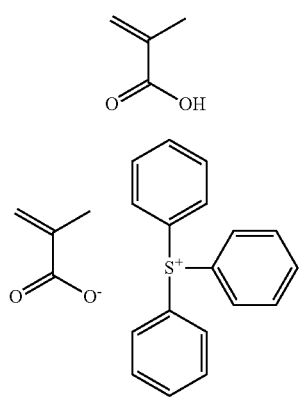

(M-22)

The synthesized compound (M-22) was identified by ¹H-NMR. The peak intensity and chemical shift are shown below.

¹H-NMR: 1.86 (s, 3H, CCH₃), 5.05 (s, 1H, CCH₂), 5.73 (s, 1H, CCH₂), 7.69-7.84 (m, 15H, ArH)

Hereinafter, each Synthesis Example of polymer (A21) is demonstrated. Each monomer used in synthesizing the polymer (A21) is shown below which is represented by the formulae (M-21) to (M-24).

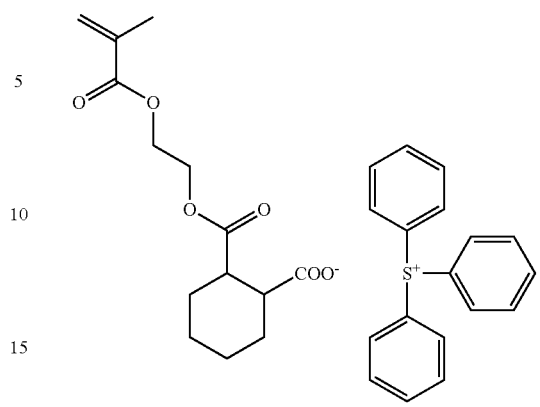

Synthesis of Polymer (A-21)

Synthesis Example 10

Monomer solutions were prepared by each dissolving 1.6 g (3% by mole) of the monomer (M-21), 8.4 g (50% by mole) of the monomer (M-23), and 10.4 g (47% by mole) of the monomer (M-24) in 60 g of 2-butanone, and further charging 1.1 g of dimethyl azobisisobutyronitrile thereto. On the other hand, a 200 ml three-necked flask charged with 30 g of 2-butanone was purged with nitrogen for 30 min, and after the nitrogen purge, the reaction vessel was heated to 80° C. while stirring. The aforementioned monomer solution prepared beforehand was added dropwise using a dropping funnel over 3 hrs. The polymerization reaction was allowed for 6 hrs from the initiation of addition of the monomer solution as the polymerization start time. After completion of the polymerization, the polymer solution was cooled with water to 30° C. or less. The polymer solution was added to 600 g of methanol, and a white powder precipitated was collected by filtration. The white powder thus collected by filtration was washed in a slurry state twice with 150 g of methanol, followed by correcting by filtration and drying at 50° C. for 17 hrs to obtain a white powdery copolymer. The Mw, Mw/Mn (molecular weight dispersity index) and the yield (% by mass) of the obtained polymer, and the proportion (% by mole) of each repeating unit in the polymer were determined. The results are shown in Table 6.

Synthesis of Polymers (A-22) to (A-23)

Synthesis Examples 11 to 12

Polymers (A-22) to (A-23) were synthesized in a similar manner to the synthesis of the resin (A-21) except that the monomers of combinations and in the mass to give the charged amount (% by mole) as shown in Table 5 were used. The Mw, Mw/Mn (molecular weight dispersity index) and the yield (% by mass) of the obtained polymer, and the proportion (% by mole) of each repeating unit in the polymer were determined. The results are shown in Table 6.

TABLE 5

| | Polymer (A) | Monomer 1 (mol %) | Monomer 2 (mol %) | Monomer 3 (mol %) | Amount of initiator (mol %) |
|---|---|---|---|---|---|
| Synthesis Example 10 | A-21 | M-21 (3) | M-23 (50) | M-24 (47) | 5 |
| Synthesis Example 11 | A-22 | M-22 (3) | M-23 (50) | M-24 (47) | 5 |
| Synthesis Example 12 | A-23 | M-23 (50) | M-24 (50) | — | 5 |

*In the parentheses next to Monomers 1 to 3, the proportion (mol %) added is shown.

TABLE 6

| | Polymer (A) | Yield (%) | Monomer 1 | Monomer 2 | Monomer 3 | Low molecular weight component (%) | Mw | Mw/Mn |
|---|---|---|---|---|---|---|---|---|
| Synthesis Example 10 | A-21 | 60.5 | 2.8 | 49.8 | 47.4 | <0.1 | 6600 | 1.38 |
| Synthesis Example 11 | A-22 | 64.5 | 2.7 | 50.1 | 47.2 | <0.1 | 6800 | 1.36 |
| Synthesis Example 12 | A-23 | 64.2 | 49.3 | 50.7 | — | <0.1 | 6900 | 1.36 |

<Preparation of Radiation-Sensitive Resin Composition>

At the proportions shown in the parentheses of each component listed in Table 7, the polymer (A), the acid generator (B), the nitrogen-containing compound (D) and the solvent (C) were mixed to prepare radiation-sensitive resin compositions of Examples 9 to 12 and Comparative Examples 4 to 5.

TABLE 7

| | Polymer (A) (part) | Acid generator (B) (part) | Nitrogen-containing compound (D) (part) | Solvent (C) (part) |
|---|---|---|---|---|
| Example 9 | A-21 (100) | B-3 (8.0) | — | C-1 (1700) C-2 (700) C-3 (30) |
| Example 10 | A-21 (100) | B-1 (5.0) B-2 (4.0) | — | C-1 (1700) C-2 (700) C-3 (30) |
| Example 11 | A-22 (100) | B-3 (8.0) | — | C-1 (1700) C-2 (700) C-3 (30) |
| Example 12 | A-21 (50) A-23 (50) | B-3 (8.0) | — | C-1 (1700) C-2 (700) C-3 (30) |
| Comparative Example 4 | A-23 (100) | B-3 (8.0) | D-1 (1.10) | C-1 (1700) C-2 (700) C-3 (30) |
| Comparative Example 5 | A-23 (100) | B-3 (8.0) | — | C-1 (1700) C-2 (700) C-3 (30) |

Details of the acid generator (B), the nitrogen-containing compound (D) and the solvent (C) listed in Table 7 are shown below. Also, in the Table, "part" is on mass basis unless otherwise stated particularly.

<Acid Generator (B)>
 (B-1): triphenylsulfonium nonafluoro-n-butanesulfonate
 (B-2): triphenylsulfonium 2-(bicyclo[2.2.1]hepta-2'-yl)-1,1-difluoroethanesulfonate
 (B-3): triphenylsulfonium 2-(bicyclo[2.2.1]hepta-2'-yl)-1,1,2,2-tetrafluoroethanesulfonate,
<Nitrogen-Containing Compound (D)>
 (D-1): N-t-butoxycarbonyl-4-hydroxypiperidine
<Solvent (C)>
 (C-1): propylene glycol monomethyl ether acetate
 (C-2): cyclohexanone
 (C-3): γ-butyrolactone
<Evaluation of Radiation-Sensitive Resin Composition>
 Various types of evaluations were made as in the following on each radiation-sensitive resin compositions of Examples 9 to 12 and Comparative Examples 4 to 5. The results of these evaluations are shown in Table 8.
<Sensitivity>
 When exposing with an ArF light source, using as a substrate a silicon wafer on which an ARC29 (manufactured by Nissan Chemical Industries, Ltd.) film having a film thickness of 770 Å had been formed on the wafer surface, each composition solution was applied on the substrate by spin coating with CLEANTRACK ACT8 (manufactured by Tokyo Electron Ltd.). A resist coating film having a film thickness of 0.09 µm was thus formed by performing PB on a hot plate under conditions shown in Table 4. The resist coating film formed as described above was exposed through a mask pattern using an ArF excimer laser exposure system "S306C" (numerical aperture: 0.78) manufactured by Nikon Corporation. After performing PEB under conditions shown in Table 8, the composition was developed at 23° C. for 60 sec with a 2.38% by mass tetramethylammonium hydroxide aqueous solution. A positive type resist pattern was formed by washing with water, and drying. In this procedure, the exposure dose was defined to be optimal provided that a line-and-space pattern (1L/1S) with a diameter of 0.090 μm in the mask can yield a size of a diameter being 0.090 μm. Such an optimum dose was defined as sensitivity.

<Cross-Sectional Shape of Pattern (Pattern Configuration)>

A cross-sectional shape of a 0.090 μm line-and-space pattern in the determination of the sensitivity as described above was observed on SEM "S-4800" manufactured by Hitachi High-Technologies Corporation. The evaluation was made as: "unfavorable" when a T-top shape (i.e., shape other than rectangular) was exhibited; or "favorable" when a rectangular shape was exhibited.

<LWR (Line Width Roughness)>

A 0.090 μm (1L/1S) pattern formed on the resist coating film on the substrate at the aforementioned optimum dose was observed from above the pattern using Measurement SEM (manufactured by Hitachi, Ltd., model "S9380"). The diameter was measured at arbitrary points, and the fluctuation as determined was indicated by 3σ.

Note that the smaller the value, the better the LWR. LWR was evaluated as "favorable" when the value was 9.0 nm or less.

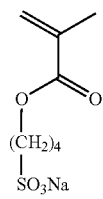

(X-31)

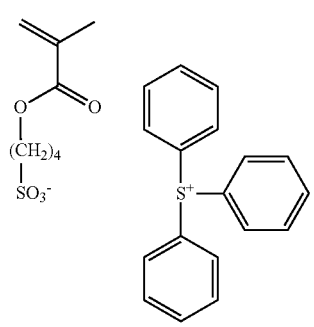

(M-31)

TABLE 8

| | PB (temperature/time) | PEB (temperature/time) | Sensitivity (mJ/cm$^2$) | Pattern Configuration | LWR |
|---|---|---|---|---|---|
| Example 9 | 110/60 | 105/60 | 45 | favorable | favorable |
| Example 10 | 110/60 | 105/60 | 38 | favorable | favorable |
| Example 11 | 110/60 | 105/60 | 30 | favorable | favorable |
| Example 12 | 110/60 | 105/60 | 36 | favorable | favorable |
| Comparative Example 4 | 110/60 | 105/60 | 34 | favorable | unfavorable |
| Comparative Example 5 | 110/60 | 105/60 | <15 | unfavorable | unfavorable |

The radiation-sensitive resin compositions according to Examples 9 to 12 had sufficient sensitivity, and were capable of forming a pattern having favorable shape and low LWR. On the other hand, the composition of Comparative Example 4 exhibited unfavorable LWR, whereas the composition of Comparative Example 5 resulted in unfavorable pattern configuration.

<Synthesis of Compound (iii)>

Synthesis Example of an onium salt compound (i.e., compound (iii)) having a polymerizable unsaturated bond and having a sulfonate anion is explained below.

<Synthesis of Compound (M-31)>

An ion exchange resin (QAE Sephadex A-25) in an amount of 20 g manufactured by GE Health Care Bioscience Ltd. was swollen in ultra pure water overnight, and packed in a column tube. Thereto was applied a solution prepared by dissolving 25 g of a compound represented by the following formula (X-31) manufactured by Asahi Kasei Finechem Co., Ltd. in water, whereby a sulfonate anion was supported on the resin. After a sufficient amount of methanol was used to permit flash back, a solution prepared by dissolving 5.2 g of triphenylsulfonium chloride in methanol was loaded on the column tube to allow for anion exchange. After the solvent of thus obtained solution was removed with an evaporator, drying at room temperature overnight gave 5.9 g of the compound (M-31) represented by the following formula (M-31).

The synthesized compound (M-31) was identified by $^1$H-NMR. The peak intensity and chemical shift are shown below.

$^1$H-NMR: 1.91 (m, 2H, O—CH$_2$—CH$_2$—), 1.92 (s, 3H, CCH$_3$), 1.99 (m, 2H, —CH$_2$—CH$_2$—SO3), 2.85 (t, 2H, —CH$_2$—SO3), 4.11 (t, 2H, O—CH$_2$—), 5.55 (s, 1H, CCH$_2$), 6.10 (s, 1H, CCH$_2$), 7.6-7.9 (m, 15H, ArH)

Hereinafter, each Synthesis Example of polymer (A31) is demonstrated. Each monomer used in synthesizing the polymer (A31) is shown below which is represented by the formulae (M-31) to (M-34).

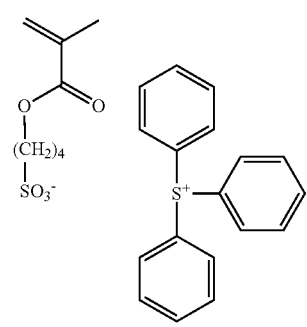

(M-31)

(M-32)
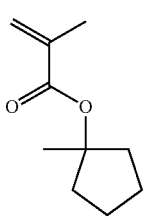

(M-33)
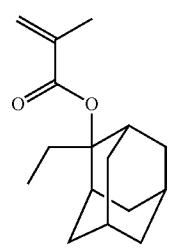

(M-34)
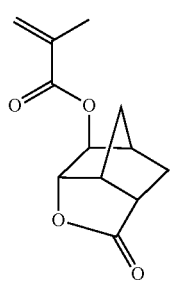

Synthesis of Polymer (A-31)

Synthesis Example 13

Monomer solutions were prepared by each dissolving 1.8 g (4% by mole) of the monomer (M-31), 6.3 g (40% by mole) of the monomer (M-32), 2.3 g (10% by mole) of the monomer (M-33), and 9.6 g (46% by mole) of the monomer (M-34) in 40 g of 2-butanone, and further charging 0.8 g of dimethyl azobisisobutyronitrile thereto. On the other hand, a 200 ml three-necked flask charged with 20 g of 2-butanone was purged with nitrogen for 30 min, and after the nitrogen purge, the reaction vessel was heated to 80° C. while stirring. The aforementioned monomer solution prepared beforehand was added dropwise using a dropping funnel over 3 hrs. The polymerization reaction was allowed for 6 hrs from the initiation of addition of the monomer solution as the polymerization start time. After completion of the polymerization, the polymer solution was cooled with water to 30° C. or less. The polymer solution was added to 400 g of methanol, and a white powder precipitated was collected by filtration. The white powder thus collected by filtration was washed in a slurry state twice with 100 g of methanol, followed by correcting by filtration and drying at 50° C. for 17 hrs to obtain a white powdery copolymer. The Mw, Mw/Mn (molecular weight dispersity index) and the yield (% by mass) of the obtained polymer, and the proportion (% by mole) of each repeating unit in the polymer were determined. The results are shown in Table 10.

Synthesis of Polymer (A-32)

Synthesis Example 14

Monomer solutions were prepared by each dissolving 6.6 g (40% by mole) of the monomer (M-32), 2.4 g (10% by mole) of the monomer (M-33), and 10.3 g (50% by mole) of the monomer (M-34) in 40 g of 2-butanone, and further charging 0.8 g of dimethyl azobisisobutyronitrile thereto. On the other hand, a 200 ml three-necked flask charged with 20 g of 2-butanone was purged with nitrogen for 30 min, and after the nitrogen purge, the reaction vessel was heated to 80° C. while stirring. The aforementioned monomer solution prepared beforehand was added dropwise using a dropping funnel over 3 hrs. The polymerization reaction was allowed for 6 hrs from the initiation of addition of the monomer solution as the polymerization start time. After completion of the polymerization, the polymer solution was cooled with water to 30° C. or less. The polymer solution was added to 400 g of methanol, and a white powder precipitated was collected by filtration. The white powder thus collected by filtration was washed in a slurry state twice with 100 g of methanol, followed by correcting by filtration and drying at 50° C. for 17 hrs to obtain a white powdery copolymer. The Mw, Mw/Mn (molecular weight dispersity index) and the yield (% by mass) of the obtained polymer, and the proportion (% by mole) of each repeating unit in the polymer were determined. The results are shown in Table 10.

TABLE 9

| | Polymer (A) | Monomer 1 (mol %) | Monomer 2 (mol %) | Monomer 3 (mol %) | Monomer 4 (mol %) | Amount of initiator (mol %) |
|---|---|---|---|---|---|---|
| Synthesis Example 13 | A-31 | M-31 (4) | M-32 (40) | M-33 (10) | M-34 (46) | 5 |
| Synthesis Example 14 | A-32 | M-32 (40) | M-33 (10) | M-34 (50) | — | 5 |

*In the parentheses next to Monomers 1 to 4, the proportion (mol %) added is shown.

TABLE 10

| | Polymer (A) | Yield (%) | Monomer 1 | Monomer 2 | Monomer 3 | Monomer 4 | Low molecular weight component (%) | Mw | Mw/Mn |
|---|---|---|---|---|---|---|---|---|---|
| Synthesis Example 13 | A-31 | 60.5 | 3.4 | 42.1 | 7.2 | 47.3 | <0.1 | 6600 | 1.35 |
| Synthesis Example 14 | A-32 | 64.5 | 39.8 | 6.9 | 53.3 | — | <0.1 | 6800 | 1.38 |

Preparation of Radiation-Sensitive Resin Composition

Examples 13 to 14, and Comparative Examples 6 to 7

At the proportions shown in the parentheses of each component listed in Table 11, the polymer (A), the acid generator (B), the nitrogen-containing compound (D) and the solvent (C) were mixed to prepare radiation-sensitive resin compositions of Examples 13 to 14 and Comparative Examples 6 to 7.

TABLE 11

| | Polymer (A) (part) | Acid generator (B) (part) | Nitrogen-containing compound (D) (part) | Solvent (C) (part) |
|---|---|---|---|---|
| Example 13 | A-31 (100) | B-1 (8.5) | — | C-1 (1700) C-2 (700) C-3 (30) |
| Example 14 | A-31 (50) A-32 (50) | B-1 (8.5) | — | C-1 (1700) C-2 (700) C-3 (30) |
| Comparative Example 6 | A-32 (100) | B-1 (8.5) | D-1 (1.10) | C-1 (1700) C-2 (700) C-3 (30) |
| Comparative Example 7 | A-32 (100) | B-1 (8.5) | — | C-1 (1700) C-2 (700) C-3 (30) |

Details of the acid generator (B), the nitrogen-containing compound (D) and the solvent (C) listed in Table 11 are shown below. Also, in the Table, "part" is on mass basis unless otherwise stated particularly.

<Acid Generator (B)>
(B-1): triphenylsulfonium 2-(bicyclo[2.2.1]hept-2'-yl)-1,1,2,2-tetrafluoroethanesulfonate,
<Nitrogen-Containing Compound (D)>
(D-1): N-t-butoxycarbonyl-4-hydroxypiperidine
<Solvent (C)>
(C-1): propylene glycol monomethyl ether acetate
(C-2): cyclohexanone
(C-3): γ-butyrolactone
<Evaluation of Radiation-Sensitive Resin Composition>
Various types of evaluations were made as in the following on each of the radiation-sensitive resin compositions of Examples 13 to 14 and Comparative Examples 6 to 7. The results of these evaluations are shown in Table 12.
<Sensitivity>
When exposing with an ArF light source, using as a substrate a silicon wafer on which an ARC29 (manufactured by Nissan Chemical Industries, Ltd.) film having a film thickness of 770 Å had been formed on the wafer surface, each composition solution was applied on the substrate by spin coating with CLEANTRACK ACT8 (manufactured by Tokyo Electron Ltd.). A resist coating film having a film thickness of 0.09 μm was thus formed by performing PB on a hot plate under conditions shown in Table 8. The resist coating film formed as described above was exposed through a mask pattern using an ArF excimer laser exposure system "S306C" (numerical aperture: 0.78) manufactured by Nikon Corporation. After performing PEB under conditions shown in Table 8, the composition was developed at 23° C. for 60 sec with a 2.38% by mass tetramethylammonium hydroxide aqueous solution. A positive type resist pattern was formed by washing with water, and drying. In this procedure, the exposure dose was defined to be optimal provided that a line-and-space pattern (1L/1S) with a diameter of 0.090 μm in the mask can yield a size of a diameter being 0.090 μm. Such an optimum dose was defined as sensitivity.
<Cross-Sectional Shape of Pattern (Pattern Configuration)>
A cross-sectional shape of a 0.090 μm line-and-space pattern in the determination of the sensitivity as described above was observed on SEM "S-4800" manufactured by Hitachi High-Technologies Corporation. The evaluation was made as: "unfavorable" when a T-top shape (i.e., shape other than rectangular) was exhibited; or "favorable" when a rectangular shape was exhibited.
<LWR (Line Width Roughness)>
A 0.090 μm (1L/1S) pattern formed on the resist coating film on the substrate at the aforementioned optimum dose was observed from above the pattern using Measurement SEM (manufactured by Hitachi, Ltd., model "S9380"). The diameter was measured at arbitrary points, and the fluctuation as determined was indicated by 3σ.
Note that the smaller the value, the better the LWR. LWR was evaluated as "favorable" when the value was 9.0 nm or less.

TABLE 12

| | PB (temperature/time) | PEB (temperature/time) | Sensitivity (mJ/cm$^2$) | Pattern Configuration | LWR |
|---|---|---|---|---|---|
| Example 13 | 110/60 | 90/60 | 53 | favorable | favorable |
| Example 14 | 110/60 | 90/60 | 40 | favorable | favorable |
| Comparative Example 6 | 110/60 | 90/60 | 44 | favorable | unfavorable |
| Comparative Example 7 | 110/60 | 90/60 | <20 | unfavorable | unfavorable |

The radiation-sensitive resin compositions according to Examples 13 to 14 had sufficient sensitivity, and were capable of forming a pattern having favorable shape and low LWR. On the other hand, the composition of Comparative Example 6 exhibited unfavorable LWR, whereas the composition of Comparative Example 7 resulted in unfavorable pattern configuration.

The radiation-sensitive resin composition of the embodiment of the present invention has sufficient radioactive ray sensitivity, and also enables formation of a resist pattern having favorable pattern with rectangular configuration, and reduction of LWR. Therefore, radiation-sensitive resin composition of the embodiment of the present invention can be suitably used as a material for lithography in which KrF excimer laser or ArF excimer laser is used as a light source.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation-sensitive resin composition comprising:

a first polymer including a repeating unit represented by a formula (I); and an acid generating component including a second polymer which includes a repeating unit represented by a formula (3), a radiation-sensitive acid generator other than the first polymer or the second polymer, or both thereof, the acid generating component generating an acid upon irradiation with actinic radiation or a radioactive ray, the first polymer serving as a base with respect to the acid where the radiation-sensitive resin composition is not irradiated with the actinic radiation or the radioactive ray,

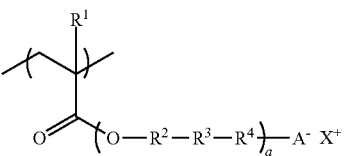
(I)

wherein $R^1$ represents a hydrogen atom, a methyl group or a trifluoromethyl group, $R^2$ represents a single bond, a linear or branched bivalent hydrocarbon group having 1 to 10 carbon atoms, a bivalent hydrocarbon group having 3 to 20 carbon atoms which has a cyclic structure formed by a part or all of the carbon atoms, or a group derived therefrom by substituting a part or all of hydrogen atoms with a fluorine atom, $R^3$ represents a single bond, a —O— group, a —C(=O)— group, a —O—C(=O)— group, a —C(=O)—O— group or a sulfinyl group, $R^4$ represents a single bond, a linear or branched bivalent hydrocarbon group having 1 to 10 carbon atoms, or a bivalent hydrocarbon group having 3 to 20 carbon atoms which has a cyclic structure formed by a part or all of the carbon atoms, $A^-$ represents —N$^-$—SO$_2$—R$^D$, —COO$^-$, —O$^-$ or —SO$_3^-$, wherein R$^D$ represents a linear or branched monovalent hydrocarbon group having 1 to 10 carbon atoms, a monovalent hydrocarbon group having 3 to 20 carbon atoms which has a cyclic structure formed by a part or all of the carbon atoms, or a group derived therefrom by substituting a part or all of hydrogen atoms with a fluorine atom, $X^+$ represents an onium cation, and "a" is 0 or 1, wherein an end of $R^4$ at SO$_3^-$ side is other than —CF$_2$— when $A^-$ is —SO$_3^-$, each of $R^2$, $R^3$ and $R^4$ is not a single bond at a same time when $A^-$ is —COO$^-$, and $A^-$ is other than —O$^-$ when "a" is 1,

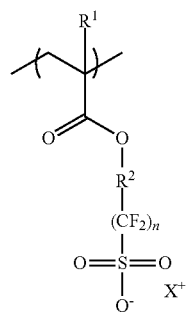
(3)

wherein, each of $R^1$, $R^2$ and $X^+$ is respectively as defined in the formula (I), and n is an integer of 1 to 4, wherein the first polymer, the second polymer, or both thereof further includes a repeating unit represented by a formula (2),

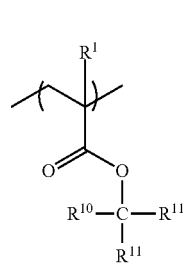
(2)

wherein $R^1$ is as defined in the formula (I), $R^{10}$ represents a monovalent alicyclic hydrocarbon group having 4 to 20 carbon atoms, and each $R^{11}$ independently represents an alkyl group having 1 to 4 carbon atoms or a monovalent alicyclic hydrocarbon group having 4 to 20 carbon atoms, or $R^{10}$ represents an alkyl group having 1 to 4 carbon atoms or a monovalent alicyclic hydrocarbon group having 4 to 20 carbon atoms, and two $R^{11}$ groups bond to each other to form a bivalent alicyclic hydrocarbon group having 4 to 20 carbon atoms together with the carbon atom to which the two $R^{11}$ groups are bound.

2. The radiation-sensitive resin composition according to claim 1, wherein $X^+$ is an onium cation represented by a formula (1-1), an onium cation represented by a formula (1-2) or a combination thereof,

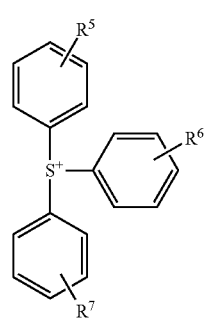
(1-1)

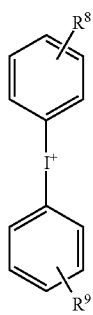

wherein each of R⁵ to R⁹ independently represents a hydrogen atom, a hydroxyl group, a halogen atom, a substituted or unsubstituted alkyl group having 1 to 10 carbon atoms, a substituted or unsubstituted cycloalkyl group having 3 to 12 carbon atoms or a substituted or unsubstituted alkoxy group having 1 to 10 carbon atoms.

3. The radiation-sensitive resin composition according to claim 1, wherein the acid generating component is the second polymer.

4. The radiation-sensitive resin composition according to claim 3, wherein X⁺ in the formula (3) is an onium cation represented by a formula (1-1), an onium cation represented by a formula (1-2) or a combination thereof,

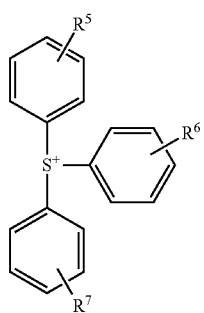

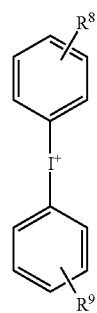

wherein each of R⁵ to R⁹ independently represents a hydrogen atom, a hydroxyl group, a halogen atom, a substituted or unsubstituted alkyl group having 1 to 10 carbon atoms, a substituted or unsubstituted cycloalkyl group having 3 to 12 carbon atoms or a substituted or unsubstituted alkoxy group having 1 to 10 carbon atoms.

5. The radiation-sensitive resin composition according to claim 1, wherein the second polymer further includes the repeating unit represented by the formula (2).

6. The radiation-sensitive resin composition according to claim 1, wherein the acid generating component is the radiation-sensitive acid generator.

7. The radiation-sensitive resin composition according to claim 1, wherein the first polymer further includes a repeating unit represented by a formula (3),

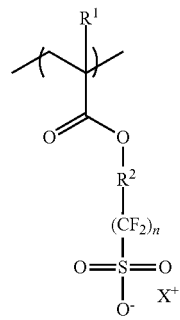

wherein each of R¹, R² and X⁺ is respectively as defined in the formula (I), and n is an integer of 1 to 4.

8. The radiation-sensitive resin composition according to claim 7, wherein X⁺ is an onium cation represented by formula (1-1), an onium cation represented by formula (1-2) or a combination thereof in at least one formula selected from the group consisting of the formula (I) and the formula (3),

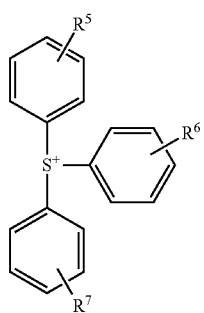

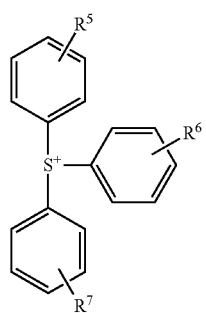

wherein each of R⁵ to R⁹ independently represents a hydrogen atom, a hydroxyl group, a halogen atom, a substituted or unsubstituted alkyl group having 1 to 10 carbon atoms, a substituted or unsubstituted cycloalkyl group having 3 to 12 carbon atoms or a substituted or unsubstituted alkoxy group having 1 to 10 carbon atoms.

9. The radiation-sensitive resin composition according to claim 1, wherein the first polymer further includes the repeating unit represented by the formula (2).

10. A radiation-sensitive resin composition comprising:
a first polymer including a repeating unit represented by a formula (1); and
an acid generating component including
a second polymer which includes a repeating unit represented by a formula (3),
a radiation-sensitive acid generator other than the first polymer or the second polymer, or
both thereof,

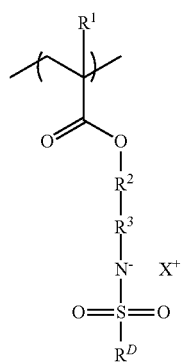

(1)

wherein
$R^1$ represents a hydrogen atom, a methyl group or a trifluoromethyl group,
$R^2$ represents a linear or branched bivalent hydrocarbon group having 1 to 10 carbon atoms, a bivalent hydrocarbon group having 3 to 20 carbon atoms which has a cyclic structure formed by a part or all of the carbon atoms, or a group derived therefrom by substituting a part or all of hydrogen atoms with a fluorine atom,
$R^3$ represents a single bond, a —C(=O)— group, a —O—C(=O)— group or a sulfinyl group,
$R^D$ represents a linear or branched monovalent hydrocarbon group having 1 to 10 carbon atoms, a monovalent hydrocarbon group having 3 to 20 carbon atoms which has a cyclic structure formed by a part or all of the carbon atoms, or a group derived therefrom by substituting a part or all of hydrogen atoms with a fluorine atom, and
$X^+$ represents an onium cation,

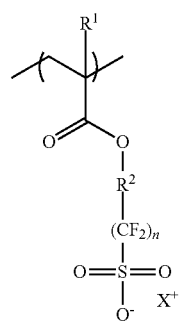

(3)

wherein, each of $R^1$, $R^2$ and $X^+$ is respectively as defined in the formula (1), and n is an integer of 1 to 4.

11. The radiation-sensitive resin composition according to claim 1, wherein the repeating unit represented by the formula (I) included in the first polymer is a repeating unit represented by a following formula (21-1), a repeating unit represented by the following formula (21-2), or a combination thereof,

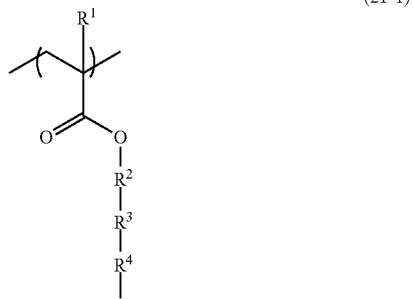

wherein
$R^1$ represents a hydrogen atom, a methyl group or a trifluoromethyl group,
$R^2$ represents a single bond, a linear or branched bivalent hydrocarbon group having 1 to 10 carbon atoms, a bivalent hydrocarbon group having 3 to 20 carbon atoms which has a cyclic structure formed by a part or all of the carbon atoms, or a group derived therefrom by substituting a part or all of hydrogen atoms with a fluorine atom,
$R^3$ represents a single bond, a —O— group, a —C(=O)— group, a —C(=O)—O— group or a —O—C(=O)— group,
$R^4$ represents a single bond, a linear or branched bivalent hydrocarbon group having 1 to 10 carbon atoms, or a bivalent hydrocarbon group having 3 to 20 carbon atoms which has a cyclic structure formed by a part or all of the carbon atoms, wherein each of $R^2$, $R^3$ and $R^4$ is not a single bond at a same time, and
$X^+$ represents an onium cation.

12. A polymer comprising:
a repeating unit represented by a formula (21-1), a repeating unit represented by a formula (21-2), or a combination thereof; and
a repeating unit represented by a following formula (2),

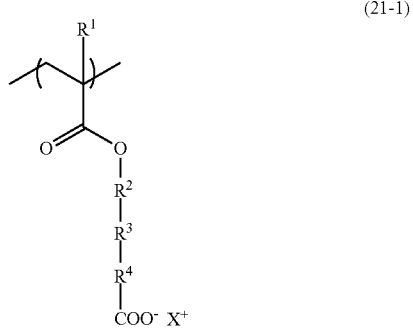

(21-1)

-continued (21-2)

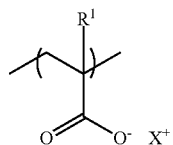

wherein
- $R^1$ represents a hydrogen atom, a methyl group or a trifluoromethyl group,
- $R^2$ represents a single bond, a linear or branched bivalent hydrocarbon group having 1 to 10 carbon atoms, a bivalent hydrocarbon group having 3 to 20 carbon atoms which has a cyclic structure formed by a part or all of the carbon atoms, or a group derived therefrom by substituting a part or all of hydrogen atoms with a fluorine atom,
- $R^3$ represents a single bond, a —O— group, a —C(=O)— group, a —C(=O)—O— group or a —O—C(=O)— group,
- $R^4$ represents a single bond, a linear or branched bivalent hydrocarbon group having 1 to 10 carbon atoms, or a bivalent hydrocarbon group having 3 to 20 carbon atoms which has a cyclic structure formed by a part or all of the carbon atoms, wherein each of $R^2$, $R^3$ and $R^4$ is not a single bond at a same time, and
- $X^+$ represents an onium cation, (2)

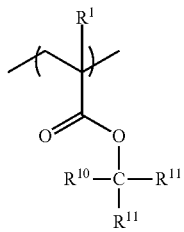

wherein
- $R^1$ is as defined in the formula (21-1),
- $R^{10}$ represents a monovalent alicyclic hydrocarbon group having 4 to 20 carbon atoms, and each $R^{11}$ independently represents an alkyl group having 1 to 4 carbon atoms or a monovalent alicyclic hydrocarbon group having 4 to 20 carbon atoms, or
- $R^{10}$ represents an alkyl group having 1 to 4 carbon atoms or a monovalent alicyclic hydrocarbon group having 4 to 20 carbon atoms, and two $R^{11}$ groups bond to each other to form a bivalent alicyclic hydrocarbon group having 4 to 20 carbon atoms together with the carbon atom to which the two $R^{11}$ groups are bound.

13. A compound represented by a following formula (i), (i)

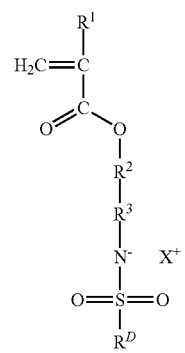

wherein
- $R^1$ represents a hydrogen atom, a methyl group or a trifluoromethyl group,
- $R^2$ represents a linear or branched bivalent hydrocarbon group having 1 to 10 carbon atoms, a bivalent hydrocarbon group having 3 to 20 carbon atoms which has a cyclic structure formed by a part or all of the carbon atoms, or a group derived therefrom by substituting a part or all of hydrogen atoms with a fluorine atom,
- $R^3$ represents a single bond, a —C(=O)— group, a —O—C(=O)— group or a sulfinyl group,
- $R^D$ represents a linear or branched monovalent hydrocarbon group having 1 to 10 carbon atoms, a monovalent hydrocarbon group having 3 to 20 carbon atoms which has a cyclic structure formed by a part or all of the carbon atoms, or a group derived therefrom by substituting a part or all of hydrogen atoms with a fluorine atom, and
- $X^+$ represents an onium cation.

14. The radiation-sensitive resin composition according to claim 10, wherein $X^+$ is an onium cation represented by a formula (1-1), an onium cation represented by a formula (1-2) or a combination thereof, (1-1)

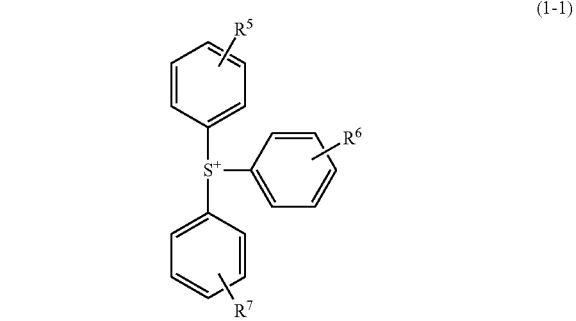

(1-2)

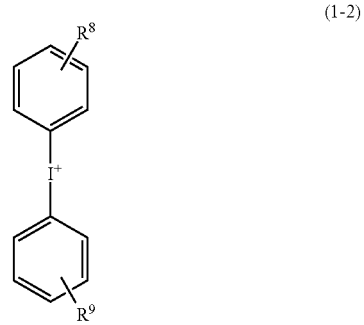

wherein each of $R^5$ to $R^9$ independently represents a hydrogen atom, a hydroxyl group, a halogen atom, a substituted or unsubstituted alkyl group having 1 to 10 carbon atoms, a substituted or unsubstituted cycloalkyl group having 3 to 12 carbon atoms or a substituted or unsubstituted alkoxy group having 1 to 10 carbon atoms.

15. The radiation-sensitive resin composition according to claim 10, wherein $X^+$ in the formula (3) is an onium cation represented by a formula (1-1), an onium cation represented by a formula (1-2) or a combination thereof,

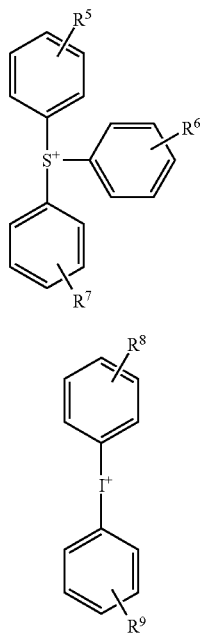

(1-1)

(1-2)

wherein each of $R^5$ to $R^9$ independently represents a hydrogen atom, a hydroxyl group, a halogen atom, a substituted or unsubstituted alkyl group having 1 to 10 carbon atoms, a substituted or unsubstituted cycloalkyl group having 3 to 12 carbon atoms or a substituted or unsubstituted alkoxy group having 1 to 10 carbon atoms.

16. The radiation-sensitive resin composition according to claim 10, wherein the second polymer further includes a repeating unit represented by a formula (2),

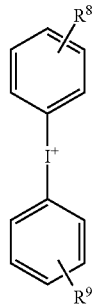

(2)

wherein
  $R^1$ is as defined in the formula (3),
  $R^{10}$ represents a monovalent alicyclic hydrocarbon group having 4 to 20 carbon atoms, and each $R^{11}$ independently represents an alkyl group having 1 to 4 carbon atoms or a monovalent alicyclic hydrocarbon group having 4 to 20 carbon atoms, or $R_{10}$ represents an alkyl group having 1 to 4 carbon atoms or a monovalent alicyclic hydrocarbon group having 4 to 20 carbon atoms, and two $R^{11}$ groups bond to each other to form a bivalent alicyclic hydrocarbon group having 4 to 20 carbon atoms together with the carbon atom to which the two $R^{11}$ groups are bound.

17. The radiation-sensitive resin composition according to claim 10, wherein the first polymer further includes a repeating unit represented by a formula (3),

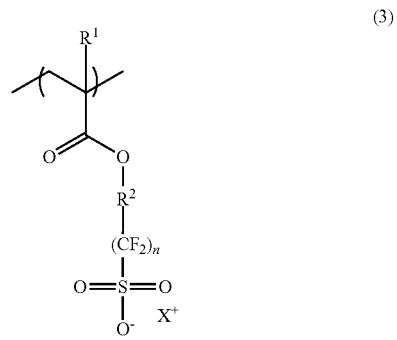

(3)

wherein each of $R^1$, $R^2$ and $X^+$ is respectively as defined in the formula (1), and n is an integer of 1 to 4.

18. The radiation-sensitive resin composition according to claim 17, wherein $X^+$ is an onium cation represented by formula (1-1), an onium cation represented by formula (1-2) or a combination thereof in at least one formula selected from the group consisting of the formula (I) and the formula (3),

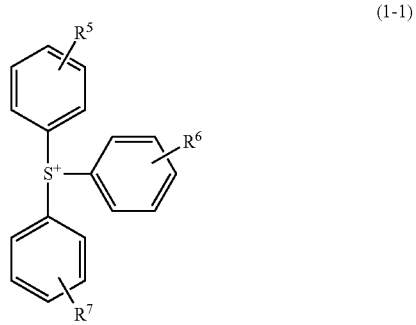

(1-1)

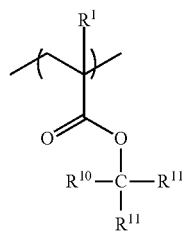

(1-2)

wherein each of $R^5$ to $R^9$ independently represents a hydrogen atom, a hydroxyl group, a halogen atom, a substituted or unsubstituted alkyl group having 1 to 10 carbon atoms, a substituted or unsubstituted cycloalkyl group having 3 to 12 carbon atoms or a substituted or unsubstituted alkoxy group having 1 to 10 carbon atoms.

19. The radiation-sensitive resin composition according to claim 10, wherein the first polymer further includes a repeating unit represented by a following formula (2),

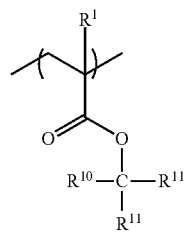

(2)

wherein
$R^1$ is as defined in the formula (3),
$R^{10}$ represents a monovalent alicyclic hydrocarbon group having 4 to 20 carbon atoms, and each $R^{11}$ independently represents an alkyl group having 1 to 4 carbon atoms or a monovalent alicyclic hydrocarbon group having 4 to 20 carbon atoms, or
$R^{10}$ represents an alkyl group having 1 to 4 carbon atoms or a monovalent alicyclic hydrocarbon group having 4 to 20 carbon atoms, and two $R^{11}$ groups bond to each other to form a bivalent alicyclic hydrocarbon group having 4 to 20 carbon atoms together with the carbon atom to which the two $R^{11}$ groups are bound.

20. The polymer according to claim 12, wherein $X^+$ in the formulas (21-1) and (21-2) is an onium cation represented by a formula (1-1), an onium cation represented by a formula (1-2), or a combination thereof,

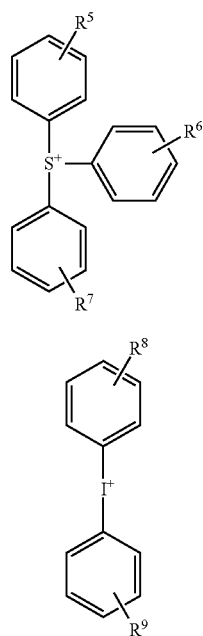

(1-1)

(1-2)

wherein each of $R^5$ to $R^9$ independently represents a hydrogen atom, a hydroxyl group, a halogen atom, a substituted or unsubstituted alkyl group having 1 to 10 carbon atoms, a substituted or unsubstituted cycloalkyl group having 3 to 12 carbon atoms, or a substituted or unsubstituted alkoxy group having 1 to 10 carbon atoms.

21. The polymer according to claim 12, further comprising:
a repeating unit represented by a formula (3),

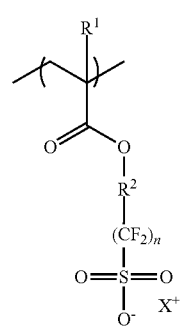

(3)

wherein each of $R^1$, $R^2$ and $X^+$ is as defined in the formula (21-1) respectively, and n is an integer of 1 to 4.

22. The polymer according to claim 21, wherein $X^+$ in the formula (3) is an onium cation represented by a formula (1-1), an onium cation represented by a formula (1-2), or a combination thereof,

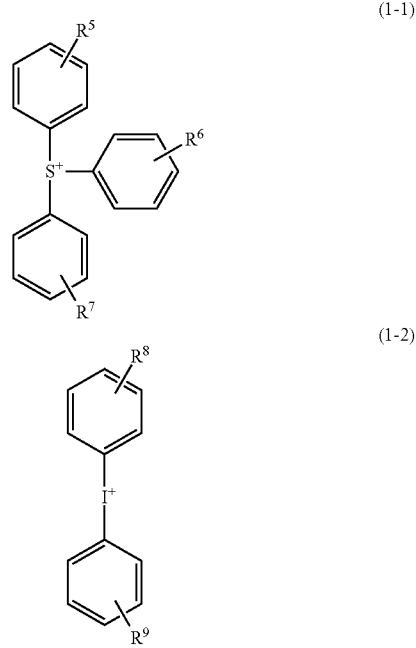

(1-1)

(1-2)

wherein each of $R^5$ to $R^9$ independently represents a hydrogen atom, a hydroxyl group, a halogen atom, a substituted or unsubstituted alkyl group having 1 to 10 carbon atoms, a substituted or unsubstituted cycloalkyl group having 3 to 12 carbon atoms, or a substituted or unsubstituted alkoxy group having 1 to 10 carbon atoms.

* * * * *